United States Patent
Steuer et al.

(10) Patent No.: US 9,363,892 B2
(45) Date of Patent: Jun. 7, 2016

(54) CIRCUIT ASSEMBLY AND CORRESPONDING METHODS

(71) Applicant: Google Technology Holdings LLC, Mountain View, CA (US)

(72) Inventors: Paul R Steuer, Hawthorn Woods, IL (US); Mark A Barabolak, Elmhurst, IL (US); Patrick J Cauwels, South Beloit, IL (US); Timothy J Sutherland, Gurnee, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 319 days.

(21) Appl. No.: 13/946,351

(22) Filed: Jul. 19, 2013

(65) Prior Publication Data
US 2015/0022986 A1    Jan. 22, 2015

(51) Int. Cl.
| | |
|---|---|
| *H05K 1/14* | (2006.01) |
| *H05K 1/11* | (2006.01) |
| *H05K 1/02* | (2006.01) |
| *H05K 5/00* | (2006.01) |
| *H05K 3/36* | (2006.01) |

(Continued)

(52) U.S. Cl.
CPC ............... *H05K 1/144* (2013.01); *H05K 1/023* (2013.01); *H05K 1/111* (2013.01); *H05K 3/368* (2013.01); *H05K 5/0017* (2013.01); *H05K 9/0022* (2013.01); *H05K 1/145* (2013.01); *H05K 3/341* (2013.01); *H05K 2201/042* (2013.01); *H05K 2201/09072* (2013.01); *H05K 2201/10371* (2013.01); *H05K 2201/10969* (2013.01); *H05K 2201/2036* (2013.01)

(58) Field of Classification Search
CPC ....... H05K 1/144; H05K 1/145; H05K 1/119; H05K 1/028
See application file for complete search history.

(56) References Cited

U.S. PATENT DOCUMENTS

| | | | | |
|---|---|---|---|---|
| 4,460,817 A | * | 7/1984 | Tani et al. ................... | 219/85.16 |
| 4,661,792 A | * | 4/1987 | Watkins ................. | H05K 1/145 336/192 |

(Continued)

FOREIGN PATENT DOCUMENTS

| | | |
|---|---|---|
| EP | 1168445 A1 | 1/2002 |
| EP | 1471604 A1 | 10/2004 |

(Continued)

OTHER PUBLICATIONS

Invitation to Pay Additional Fees and Partial Search Report for PCT Patent Application No. PCT/US2014/047074, mailed on Jan. 8, 2015, 6 pages.

(Continued)

*Primary Examiner* — Jeremy C Norris
*Assistant Examiner* — Nathan Milakovich

(57) ABSTRACT

A circuit assembly (1800) includes a first circuit substrate (1200) defining a first major face (1201) and a second circuit substrate (1500) defining a second major face (1502). A plurality of electrical components (1203,1204,1205) can be disposed on one or more of the first major face or the second major face. One or more substrate bridging members (1301, 1302,1303,1304) are disposed between the first circuit substrate and the second circuit substrate. Each substrate bridging member can define a unitary structure having a first end bonded to the first major face and a second end bonded to the second major face to bridge the first circuit substrate and the second circuit substrate.

20 Claims, 23 Drawing Sheets

(51) Int. Cl.
*H05K 9/00* (2006.01)
*H05K 3/34* (2006.01)

(56) References Cited

U.S. PATENT DOCUMENTS

| | | | |
|---|---|---|---|
| 6,608,756 B2* | 8/2003 | Higashida et al. | 361/748 |
| 6,712,620 B1* | 3/2004 | Li et al. | 439/63 |
| 6,917,526 B2* | 7/2005 | Ajioka et al. | 361/816 |
| 7,258,549 B2* | 8/2007 | Asahi et al. | 439/66 |
| 7,365,992 B2 | 4/2008 | Lee | |
| 7,489,524 B2* | 2/2009 | Green | H05K 3/366 361/803 |
| 7,557,307 B2* | 7/2009 | Nishizawa et al. | 174/384 |
| 7,643,305 B2* | 1/2010 | Lin | 361/749 |
| 7,729,131 B2 | 6/2010 | Wang et al. | |
| 7,952,889 B2* | 5/2011 | Chao | 361/816 |
| 8,159,829 B2* | 4/2012 | Mori et al. | 361/761 |
| 8,363,422 B2* | 1/2013 | Sakinada et al. | 361/799 |
| 2011/0063814 A1* | 3/2011 | Nimura et al. | 361/796 |
| 2011/0248389 A1* | 10/2011 | Yorita et al. | 257/659 |
| 2014/0233191 A1* | 8/2014 | Kakehashi | H05K 1/144 361/729 |
| 2014/0345123 A1* | 11/2014 | Chamberlin et al. | 29/830 |
| 2014/0347000 A1* | 11/2014 | Hamann et al. | 320/103 |
| 2015/0022978 A1* | 1/2015 | Steuer et al. | 361/749 |
| 2015/0201496 A1* | 7/2015 | Liao et al. | 361/721 |

FOREIGN PATENT DOCUMENTS

| | | | | |
|---|---|---|---|---|
| EP | 2627160 A1 | * | 8/2013 | |
| GB | 14518 | * | 6/1913 | |
| WO | WO 2008059643 A1 | * | 5/2008 | H05K 1/14 |
| WO | 2015/009957 A2 | | 1/2015 | |

OTHER PUBLICATIONS

International Search Report and Written Opinion for PCT Patent Application No. PCT/US2014/047074, mailed on Mar. 10, 2015, 16 pages.

* cited by examiner

CIRCUIT ASSEMBLY AND CORRESPONDING METHODS

BACKGROUND

1. Technical Field

This disclosure relates generally to a circuit assembly, and more particularly to a circuit assembly for electronic devices.

2. Background Art

"Intelligent" portable electronic devices, such as smart phones, tablet computers, and the like, are becoming increasingly powerful computational tools. Moreover, these devices are becoming more prevalent in today's society. For example, not too long ago a mobile telephone was a simplistic device with a twelve-key keypad that only made telephone calls. Today, "smart" phones, tablet computers, personal digital assistants, and other portable electronic devices not only make telephone calls, but also manage address books, maintain calendars, play music and videos, display pictures, and surf the web.

As the capabilities of these electronic devices have progressed, so too have their user interfaces. Keypads having a fixed number of keys have given way to sophisticated user input devices such as touch sensitive screens or touch sensitive pads. Touch sensitive displays include sensors for detecting the presence of an object such as a finger or stylus. By placing the object on the touch sensitive surface, the user can manipulate and control the electronic device without the need for a physical keypad.

One drawback to the increasingly sophisticated technologies on modern electronic devices is that they are increasingly prone to damage. If a display or other component becomes damaged, perhaps due to drop impact, the device can be rendered unusable. It would be advantageous to have an improved electronic device with increased structural stability without compromising size or performance measurements.

Figure 1:
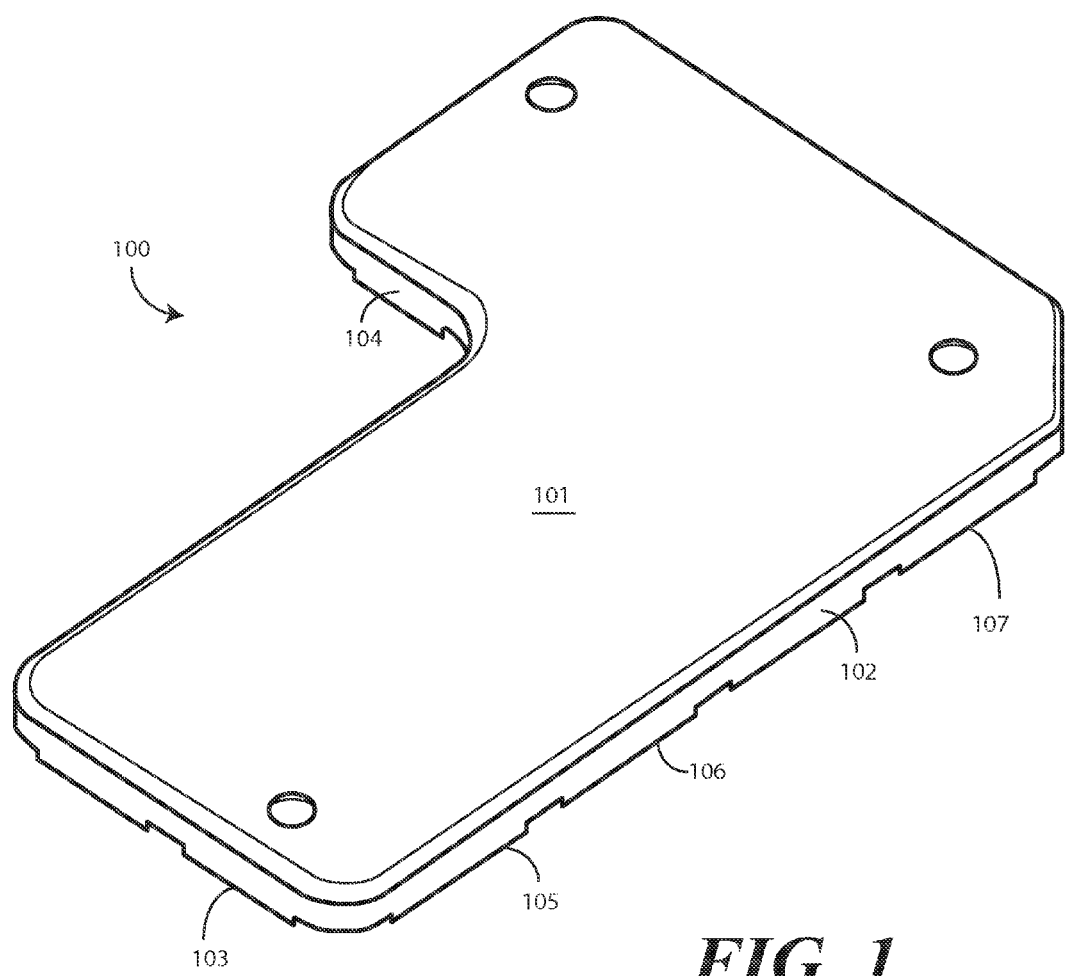
FIG. 1 illustrates a prior art shield.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

As electronic devices become smaller and thinner, their components can become more fragile. A large, blocky device can provide padding and mechanical support for the external components when the device is dropped for example. When housing members and other mechanical structures become thinner, items that once provided mechanical strength can become flexible and prone to damage from external forces. Embodiments of the disclosure contemplate that there is a need in thin devices to increase the mechanical strength of the overall device. At the same time, this increase in structural stability must be accomplished without causing the device to get thicker and without sacrificing electrical and system performance.

Embodiments of the disclosure revolutionize conventional circuit assemblies by bonding substrate bridging members between two circuit substrates. Where the substrate bridging members are metal, or have metal coated or disposed thereon, they can be arranged to provide both mechanical and electromagnetic functions within a circuit assembly. For example, the substrate bridging members can be disposed about an electromagnetically sensitive component to shield the component from electromagnetic energy. At the same time, by bonding the substrate bridging members between two substantially parallel circuit substrates, a "honeycomb" structure is created that provides increase mechanical support and stability to the circuit assembly. Accordingly, mechanical strength can be increased from within the circuit substrate. This is in contrast to prior art designs where mechanical strength is applied to a circuit substrate by a mechanical housing or exoskeleton. Embodiments of the disclosure provide very robust and mechanically sound circuit assemblies, and thus robust and mechanically sound electronic devices, without the need for increasing the mechanical features of the housing or exterior framing materials. As will be shown below, in one or more embodiments, a robust electronic device can be created using a minimal housing that is simply snapped about the circuit assembly. The robustness of this assembly is derived by the increased mechanical strength of the interior circuit assembly.

In one embodiment, a circuit assembly comprises a first circuit substrate and a second circuit substrate. In one embodiment, the circuit substrates are fiberglass or FR4 printed circuit boards defining major faces on each side. FR4 is a grade designation assigned to glass-reinforced epoxy laminate sheets. For example, the first circuit substrate can define a first major face, while the second circuit substrate defines a second major face, and so forth.

A plurality of electrical components can be disposed on one or more of the major faces. For example, in one embodiment a plurality of electrical components is disposed on the first major face of the first circuit substrate. In another embodiment, a plurality of electrical components is disposed on two sides of the first circuit substrate. In another embodiment, a plurality of electrical components is disposed on one or both sides of the second circuit substrate. Of course, combinations of these embodiments can be used as well.

One or more substrate bridging members is then bonded between the two substrates. In one embodiment, the one or more substrate bridging members are soldered to the first circuit substrate such that they extend substantially perpendicularly from a major face of the first circuit substrate. The second circuit substrate can then be oriented substantially parallel with the first circuit substrate so that the other end of one or more of the substrate bridging members can be bonded to one of its major faces. In one embodiment, the second bonding comprises soldering that occurs when current is applied to a solder pad and resistive element assembly. This results in each substrate bridging member defining a unitary structure having a first end bonded to the first major face and a second end bonded to the second major face to bridge the first circuit substrate and the second circuit substrate. This "double-board" assembly creates a "honeycomb" effect between the two circuit substrates and greatly increases bend strength and resistance to twisting, especially where the substrate bridging members are disposed along the two circuit substrates with sufficient density. Circuit assemblies configured in accordance with embodiments of the disclosure can remove the need for an exoskeleton and screws when used in electronic devices. In short, one or more embodiments of the disclosure provide a structurally strong method of stacking circuit boards or substrates so that that device housing elements are no longer needed to provide "structure" or mechanical rigidity to the device.

Prior to explaining embodiments of the disclosure, a discussion of prior art electronic devices is in order. Turning to FIG. 1, illustrated therein is a prior art shield 100. As shown, the prior art shield 100 has a planar top surface 101 and planar sidewalls 102,103,104 extending orthogonally from each edge of the planar top surface 101. This particular prior art shield 100 includes flanges 105,106,106 so that the prior art shield 100 can be soldered to a circuit board.

Figure 2:
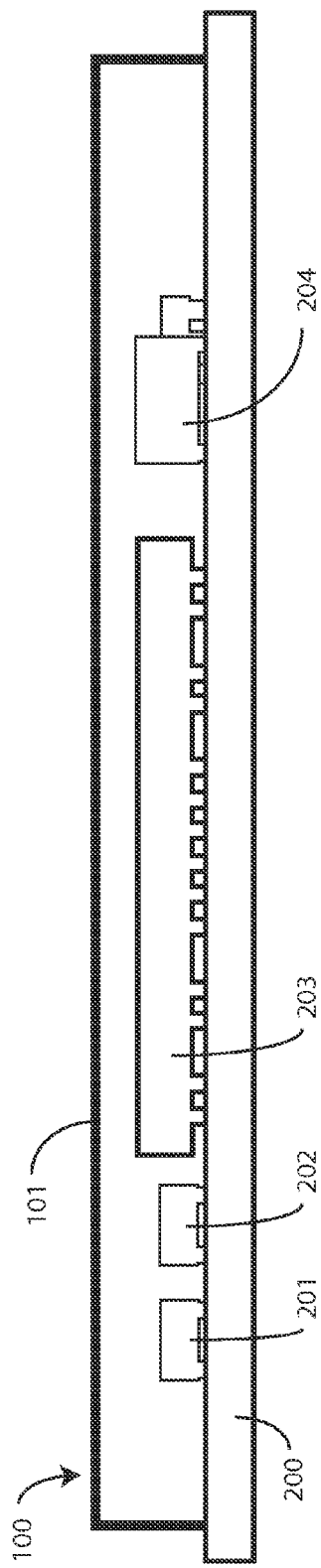
FIG. 2 illustrates a sectional, elevation view of a prior art shield.

Turning to FIG. 2, illustrated therein is the prior art shield 100 coupled to a printed circuit board 200. The planar top surface 101 covers several electrical components 201,202, 203,204.

Figure 3:
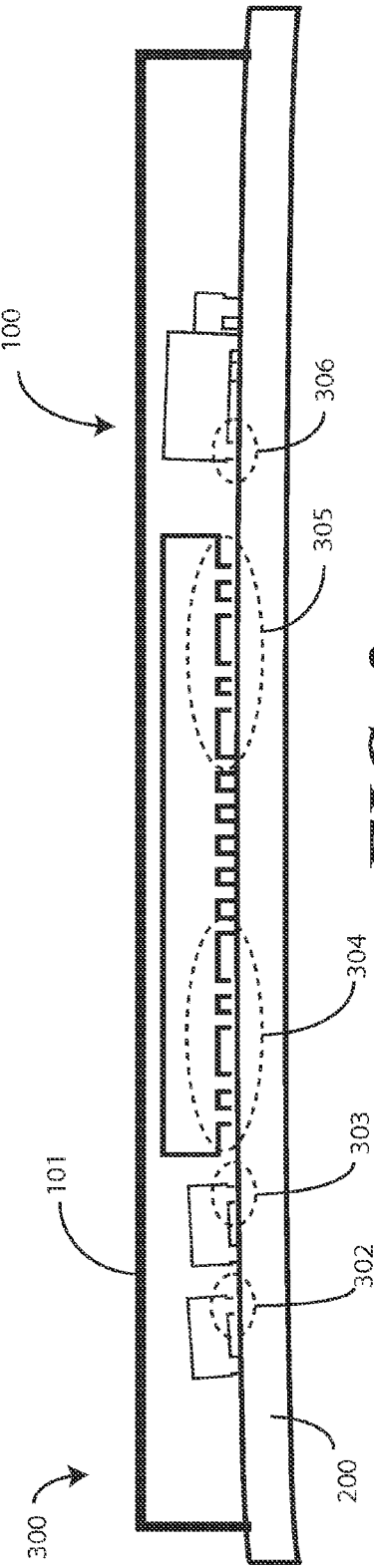
FIG. 3 illustrates an exploded view of a prior art device.

Turning to FIG. 3, the circuit board 200 is being subjected to mechanical loading. This loading is typical of loading the circuit board 200 may experience in a thin electronic device when the device is dropped or otherwise subjected to mechanical forces. As shown at point 301, this causes the circuit board 200 to flex. This occurs because the thin device may not have sufficient mechanical support to adequately provide resistance to the mechanical forces.

The prior art shield 100, being manufactured from a thick metal, remains rigid. Accordingly, the assembly 300 functions like an inverted trampoline, with the prior art shield 100 serving as the trampoline frame, and the circuit board 200 serving as the trampoline mat. Each of the electrical components 201,202,203,204 translates vertically toward the planar top surface 101 of the prior art shield 100, thereby causing electrical connections to be broken at points 302,303,304, 305,306. This "trampoline effect" renders the assembly 300 non-functional.

Embodiments of the present disclosure serve to prevent the trampoline effect—as well as other mechanical distortions of a circuit assembly and/or components attached thereto—by providing substrate bridging members disposed interior to two layered circuit substrates. This results in a shield with increased mechanical structure and with features that limit the vertical translation that a substrate—or components coupled thereto—can make, thereby reducing or preventing damage. In one embodiment, a circuit assembly comprises a first substrate defining a first side of the circuit assembly and a second substrate defining a second side of the circuit assembly. One or more substrate bridging members are then disposed interior to the circuit assembly. Each substrate bridging member has a unitary structure with a first end soldered or otherwise bonded to the first substrate and a second end soldered or otherwise bonded to the second substrate.

Embodiments of the disclosure have several advantages over prior art designs. To begin, the honeycomb structure defined by the substrate bridging members provides resistance to the trampoline effect by increasing the assembly's resistance to bending. Second, the honeycomb structure improves the bending moment and reduces twisting of the assembly. Third, the honeycomb structure increases the available major face area of each circuit substrate along which electronic components can be placed compared to prior art designs.

Figure 4:
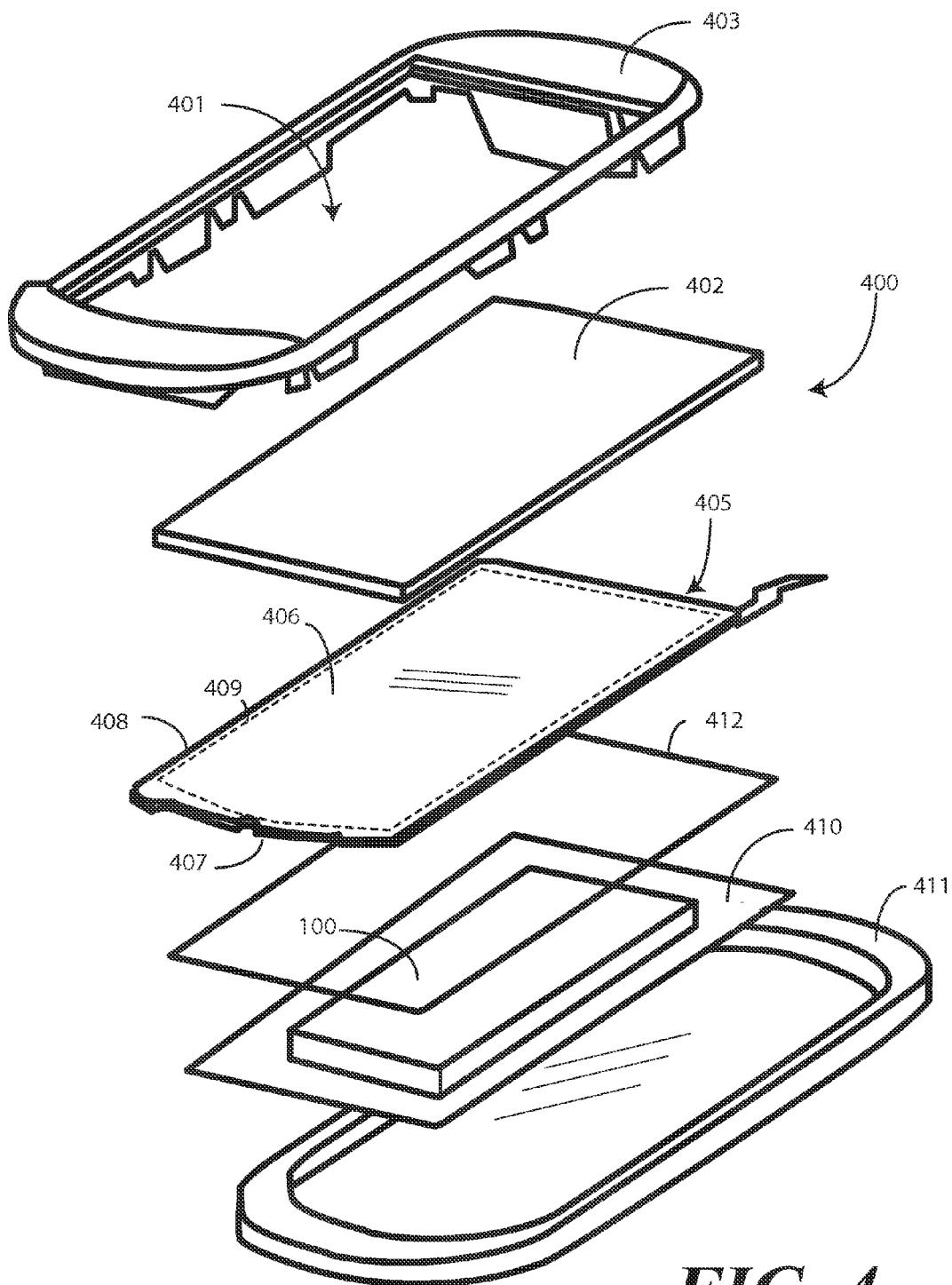
FIG. 4 illustrates a prior art device.

To better understand some of the advantages offered by embodiments of the disclosure, it is well to understand how prior art electronic devices are traditionally made. Turning now to FIG. 4, illustrated therein is a prior art electronic device 400.

A first housing member 403 is shown above a fascia layer 402. The first housing member 403 defines an aperture 401. The fascia layer 402 fits within the first housing member 403 to span and cover the aperture 401. Some designers refer to the fascia layer 402 as a "lens," although the fascia layer 402 generally does not include optical magnification properties.

A display assembly 405 is disposed beneath the fascia layer 402. The illustrative display assembly 405 of FIG. 4 includes two substrate layers 406,407 sealed together at a seam 408 disposed along a periphery of each substrate layer 406,407. As used herein, "periphery" refers to an outer region of an area or object, or in this case, an outer region disposed just within a perimeter 409 of the substrate layers 406,407.

A circuit board 410 having the shield 100 of FIG. 1 coupled thereto is then disposed beneath the display assembly 405. A second housing member 411 can then be coupled to the first housing member 403 to provide mechanical support to the display assembly 405, circuit board 410, and other electronic components.

While the prior art design can work well in practice, when one desires a very thin device, problems can arise. Illustrating by example, in one embodiment the display assembly 405 comprises two substrate layers 406,407 having a liquid crystal or organic polymer disposed therebetween. In the case of an organic light emitting diode layer, a film of organic material will be disposed between the two substrate layers 406, 407. Each substrate layer 406,407 is coupled to the other by the seam 408. The seam 408 can be formed by fusing the two substrate layers 406,407 together with a fused weld known as a "frit." A frit is a ceramic composition that is thermally fused between layers of glass to form a seam or seal between those two substrates. Experimental testing has shown the frit forming the seam is very brittle. Moreover, testing has shown that the frit forming the seam fractures easily allowing the glass substrates to separate in a cleavage mode. When this occurs, the organic film sealed between the glass substrates and the frit then leaks out, rendering the display inoperable. Unless the first housing member 403 and the second housing member 411 are sufficiently thick as to provide sufficient mechanical support, dropping the prior art electronic device 400 can cause the frit to break, thereby rendering the prior art electronic device 400 unusable. This thickness and mechanical support requirement limits how thin the prior art electronic device 400 can ultimately become.

A second problem involves the trampoline phenomenon discussed above with reference to FIG. 3. Unless the first housing member 403 and the second housing member 411 are sufficiently thick as to provide sufficient mechanical support, dropping the prior art electronic device 400 can cause electronic components to break from the circuit board 410 due to the trampoline effect. Such breakage can render the prior art electronic device 400 unusable. This thickness and mechanical support requirement further limits how thin the prior art electronic device 400 can ultimately become.

Other problems with the prior art electronic device 400 involve cost and manufacturing issues. In many embodiments, the prior art electronic device will include a metal frame 412 that is manufactured from a metal such as zinc or magnesium. The metal frame 412 is generally not a shield. Sometimes the metal frame 412 takes the shape of a "figure eight," sometimes it is disposed just on the exterior of the circuit board 410 shown in FIG. 4, and sometimes it has two sections running through it instead of one. In any event, the function of the metal frame 412 is to reside about the perimeter of the circuit board 410 and to hold the circuit board 410 in place.

The circuit board 410 physically mounts to the metal frame 412, and the metal frame 412 physically mounts to either the first housing member 403 or the second housing member 411. Foam or other supporting materials are then stuffed beneath the display assembly 405 and the first housing member 403 is attached to the second housing member 411 with several screws (not shown) that may pass through or into the metal frame 412.

The problem with this design is twofold: First, where the first housing member 403 and second housing member 411 are plastic, the stiffest element in the prior art electronic device 400 is the display assembly 405. Since the shield 100 spans only a portion of the circuit board 410, it can form a fulcrum under the display assembly 405. Accordingly, the device needing the most protection, i.e., the display assembly 405, is the stiffest element and is sitting on a fulcrum attached to a circuit board 410 that can trampoline when exposed to external mechanical forces. When the prior art electronic device 400 is dropped and the housing members are too thin, damage occurs. Moreover, as the housing members get thinner and thinner, it becomes more and more difficult to protect the display assembly 405.

The second problem is cost. The metal frame 412 is quite expensive. The screws are cumbersome and costly to install and to remove for reworking purposes. Some assemblies require solder balls to be added to the intersection of the shield 100 and circuit board 410 in an attempt to add rigidity to the circuit board 410 as well. When the circuit board 410 is reworked in service, heating of the shield(s) (there can be more than one) is required twice—once to remove the shield(s) and once to replace the shield(s). Such heating can cause electrical components on the circuit board 410 to become dislodged, thereby requiring an additional reflow or hand soldering operation. All of these issues combine to make the prior art electronic device 400 very costly.

Embodiments of the present disclosure advantageously work to prevent cleavage and other failure modes, and also to reduce cost, by providing a circuit assembly comprising a first substrate defining a first side of the circuit assembly and a second substrate defining a second side of the circuit assembly. At least one electrical component is disposed on at least one of the first substrate or the second substrate interior to the circuit assembly. One or more unitary shield elements disposed interior to the circuit assembly and having a first end soldered to the first substrate and a second end soldered to the second substrate. This will be explained in more detail below.

Turning now to FIGS. 5-8, illustrated therein are views of one explanatory substrate bridging member 500 configured in accordance with one or more embodiments of the disclosure. The embodiment of FIGS. 5-8 is one of the simpler bridging member configurations. Other more complex ones will be shown with reference to FIGS. 9 and 10 below. Of course, each of these embodiments is explanatory only, as numerous other bridging member configurations will be obvious to those of ordinary skill in the art having the benefit of this disclosure.

Figure 5:
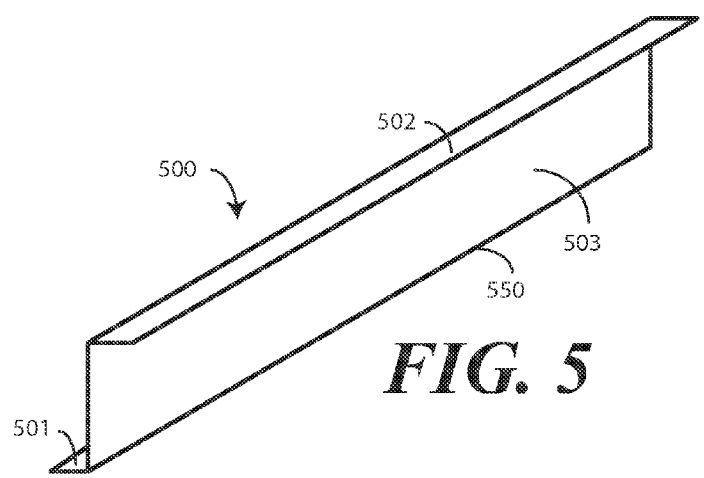
FIG. 5 illustrates a perspective view of one explanatory substrate bridging member in accordance with one or more embodiments of the disclosure.
Figure 6:
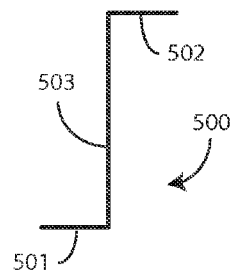
FIG. 6 illustrates a side elevation view of one explanatory substrate bridging member in accordance with one or more embodiments of the disclosure.
Figure 7:
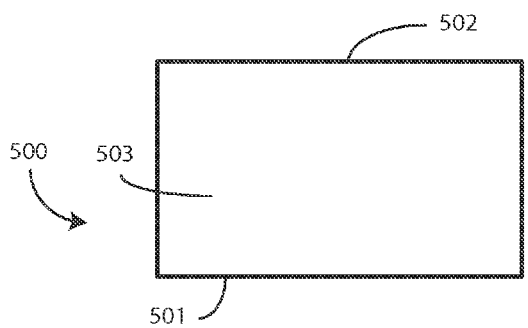
FIG. 7 illustrates a front elevation view of one explanatory substrate bridging member in accordance with one or more embodiments of the disclosure.
Figure 8:
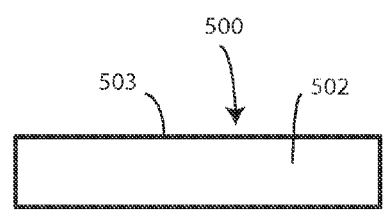
FIG. 8 illustrates a top plan view of one explanatory substrate bridging member in accordance with one or more embodiments of the disclosure.

FIG. 5 illustrates a perspective view of the substrate bridging member 500, while FIG. 6 illustrates a side elevation view thereof. FIG. 7 illustrates a front elevation view of the substrate bridging member 500, while FIG. 8 illustrates a top plan view thereof.

The substrate bridging member 500 can be made from a variety of materials. In one embodiment, the substrate bridging member 500 is manufactured from metal. Metal is a suitable material for the substrate bridging member 500 for multiple reasons. First, when the substrate bridging member 500 is made from metal, multiple substrate bridging members can be placed about the perimeter of one or more electrical components to electromagnetically shield the one or more electrical components. Second, in one or more embodiments the substrate bridging member 500 is soldered to a pair of circuit substrates. Manufacturing the substrate bridging member 500 from metal facilitates soldering or plating for soldering processes.

In one embodiment, the substrate bridging member 500 is made from a bendable metal that is easily formable and works well in plating processes. Plating can be advantageous when the substrate bridging member 500 is used in soldering operations. In one or more embodiments, the substrate bridging member 500 is a soft, malleable metal that works well in forming processes. In one embodiment, the thickness of the substrate bridging member 500 is about 0.15 millimeters to 0.2 millimeters. However, it should be noted that the thickness of the substrate bridging member 500 could vary is, for example, one identified an area along the substrate bridging member 500 requiring increased stiffness.

In one embodiment, the substrate bridging member 500 can be manufactured from a sheet metal frame. In another embodiment, the substrate bridging member 500 can be machine formed from cold rolled steel. In other embodiments, the substrate bridging member 500 can be manufactured from cast metal. Other materials and methods of manufacture for the shield will be obvious to those of ordinary skill in the art having the benefit of this disclosure. Illustrating by example, the substrate bridging member 500 could be manufactured from a material other than metal, but plated with tin or other materials to facilitate soldering to one or more circuit substrates. In yet other embodiments, the substrate bridging member 500 could be manufactured from other materials, such as plastic, that then may be bonded to substrates with adhesives or other techniques.

In one or more embodiments, the substrate bridging member 500 defines a unitary structure having a first end 501, a bridge wall 503, and a second end 502. As used herein, "unitary" is used to mean a single or uniform entity that includes a single piece of material. Accordingly, the substrate bridging member 500 of FIGS. 5-8 is "unitary" in that a singular piece of metal is used to create the first end 501, the second end 502, and the bridge wall 503.

In one or more embodiments, the first end 501 can simply be the base of the bridge wall 503. Said differently, while the first end 501 extends substantially orthogonally from the bridge wall 503 in the explanatory embodiment of FIG. 5, the bottom edge 550 of the bridge wall 503 could define the first end 501 in other embodiments, examples if which will be shown below with reference to FIGS. 20-21. Also, while the first end 501 and second end 502 are shown as being substantially parallel in FIG. 5, they may be skew or non-parallel as shown in FIG. 22 below. Other configurations will be obvious to those of ordinary skill in the art having the benefit of this disclosure.

As will be described with reference to FIGS. 12-17 below, where manufactured from metal, the explanatory substrate bridging member 500 can be used to shield integrated circuits or other electronic components from electromagnetic emissions. The first end 501 of one or more substrate bridging members 500 can be soldered or otherwise coupled to a circuit substrate so as to extend distally from the circuit substrate along a perimeter of at least one of a plurality of electronic components. In one or more embodiments, the one or more substrate bridging members 500 extend substantially orthogonally from the circuit substrate such that their bridge walls 503 form a wall about the perimeter of the electronic components. A second substrate can then be soldered or otherwise coupled to the second end 502 of the one or more substrate bridging members 500. Where one or more of the first circuit substrate or the second circuit substrate comprising a ground plane interior to the perimeter defined by the one or more substrate bridging members 500, the ground plane can form the "top" of a "shield" defined by the one or more substrate bridging members 500 and the ground plane.

Where used as a shield, the substrate bridging members are suitable for use in many different types of electronic devices. Illustrating by example, the substrate bridging members 500 can be used in mobile communication devices, such as smartphones, tablet computers, and so forth. Those of ordinary skill in the art having the benefit of this disclosure will understand that mobile communication devices are merely one type of electronic device for which the substrate bridging members 500 are suited, and are being used purely for illustrative purposes. Shields configured in accordance with one or more embodiments of the disclosure are certainly usable and compatible with any number of different structures and devices.

Figure 9:
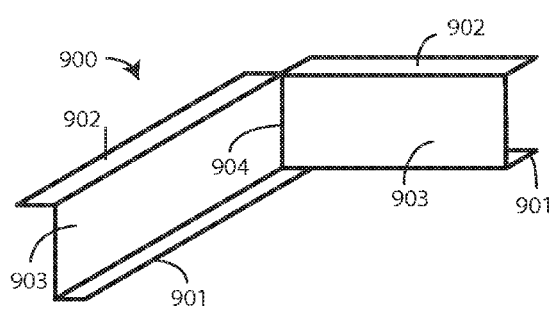
FIG. 9 illustrates a perspective view of an alternate substrate bridging member in accordance with one or more embodiments of the disclosure.
Figure 10:
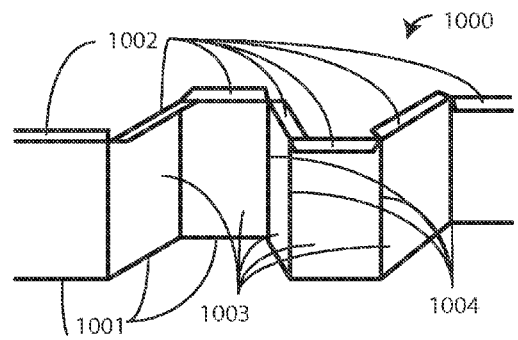
FIG. 10 illustrates a perspective view of another alternate substrate bridging member in accordance with one or more embodiments of the disclosure.

Turning to FIG. 9, illustrated therein is another explanatory substrate bridging member 900. Like the substrate bridging member (500) of FIGS. 5-8, the substrate bridging member 900 of FIG. 9 defines a unitary structure having a first end 901, a bridge wall 903, and a second end 902. However, the substrate bridging member 900 of FIG. 9 differs from that of FIG.

5 in several ways. First, even though the substrate bridging member 900 is still unitary, the first end 901 and the second end 902 are segmented and include disconnected segments. Second, the bridge wall 903 is non-linear due to a bend 904 located interior to the bridge wall's edges.

By applying different bends to various portions of the substrate bridging member 900, any number of segments of the first end 901 and the second end 902 can be formed. Additionally, the bridge wall 903 can take a variety of shapes. This is shown illustratively in FIG. 10, where the first end 1001 and the second end 1002 of the substrate bridging member 1000 are multi-segmented due to multiple bends 1004 occurring in the bridge wall 1003. The shapes and structures of the substrate bridging members of FIGS. 5-10 are illustrative only. Others will be obvious to those of ordinary skill in the art having the benefit of the disclosure.

In the illustrative embodiments of FIGS. 5-10, the first end and second end of each substrate bridging member extends substantially orthogonally from its respective bridge wall. Using the substrate bridging member 500 of FIG. 5 as an example, the first end 501 extends substantially orthogonally from the bridge wall 503. Similarly, the second end 502 extends substantially orthogonally from the bridge wall 503. This configuration is advantageous for a couple of reasons. First, the orthogonal first and second ends assist in the substrate bridging member 500 being able to "stand up" on a circuit substrate prior to soldering or other coupling operations. For example, if the substrate bridging member 500 is placed such that the first end 501 is in solder paste disposed on a major face of a substrate prior to a reflow operation, the orthogonal nature of the first end 501 provides additional surface area to contact with the solder paste. Second, the orthogonal nature of the first end 501 and the second end 502 makes mechanical assembly via pick and place operations simpler.

While orthogonal ends are one illustrative embodiment, others will be obvious to those of ordinary skill in the art having the benefit of this disclosure. For example, in some embodiments, the first end 501 and second end 502 will not extend outwardly at all from the bottom edge of the bridge wall 503. In other embodiments, each of the first end 501 and the second end 502 will have dimensions less than that of the bridge wall 503 such that multiple segments can extend from the bottom edge of the bridge wall 503. Said differently, multiple "feet" can form the first end 501 or the second end 502, rather than the single "foot" shown in FIG. 5.

In one or more embodiments, one or more of the first end 501 or the second end 502 will be plated to facilitate soldering. Illustrating by example, in one or more embodiments, the first end 501 and the second end 502 can be tin-plated to make soldering more reliable.

Figure 11:
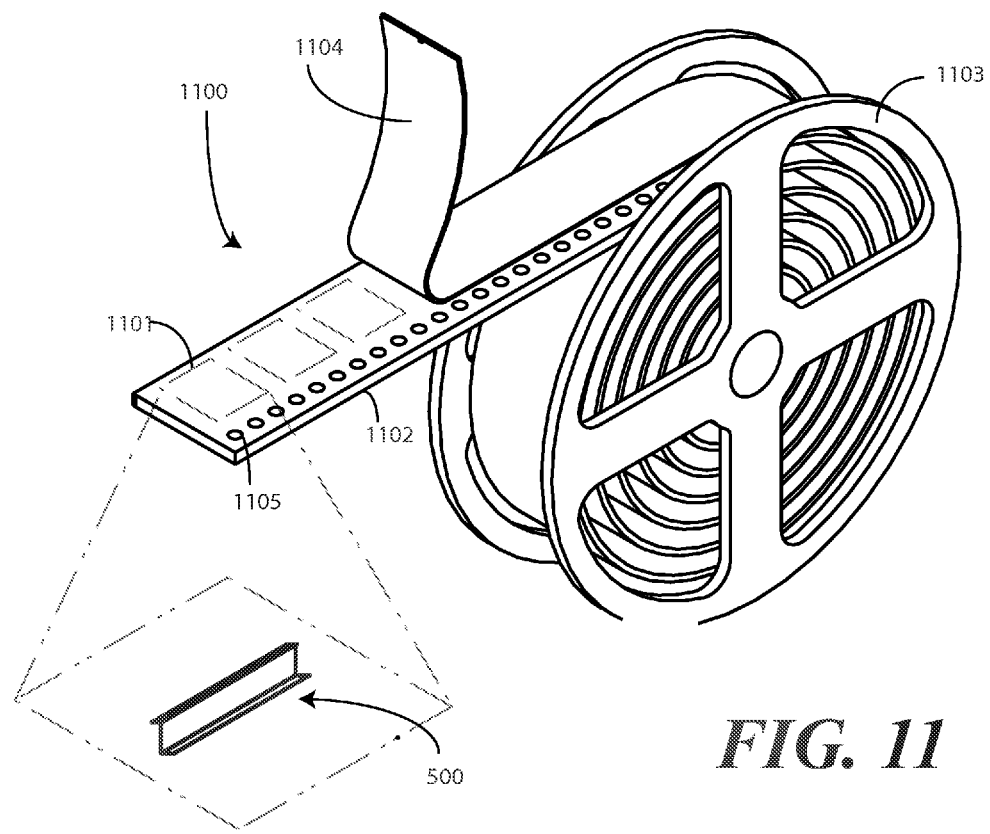
FIG. 11 illustrates a substrate bridging member configured in accordance with one or more embodiments of the disclosure in illustrative packaging.

As noted above, in one or more embodiments, the substrate bridging member 500 can be placed on a circuit substrate by way of a pick and place operation. Turning now to FIG. 11, illustrated therein is illustrative packaging suitable for use with the substrate bridging member 500 in pick and place operations. As shown in FIG. 11, in one embodiment, the substrate bridging member 500 can be packaged and dispensed from a tape and reel package 1100. Tape and reel provides a suitable packaging for the substrate bridging member 500 where an area of one of the first end (501) or the second end (502) is sufficient for rapid picking and placing by industrial pick and place machines. A tape and reel package 1100 can be modified to carry a plurality of substrate bridging members, regardless of shape, within each dispensing area 1101 or individual cells. The tape and reel package 1100 can include a tape 1102 carried by a reel 1103 with a number of dispensing areas disposed along the tape 1102. The tape 1102 can be covered by a cover strip 1104. The substrate bridging members disposed in the tape 1102 can progress and be dispensed in a pick and place machine using a series of sprockets or holes 1105 to move the tape 1102 along as needed. In one embodiment, the substrate bridging members are packaged in the individual cells to avoid damage and/or contamination.

Figure 12:
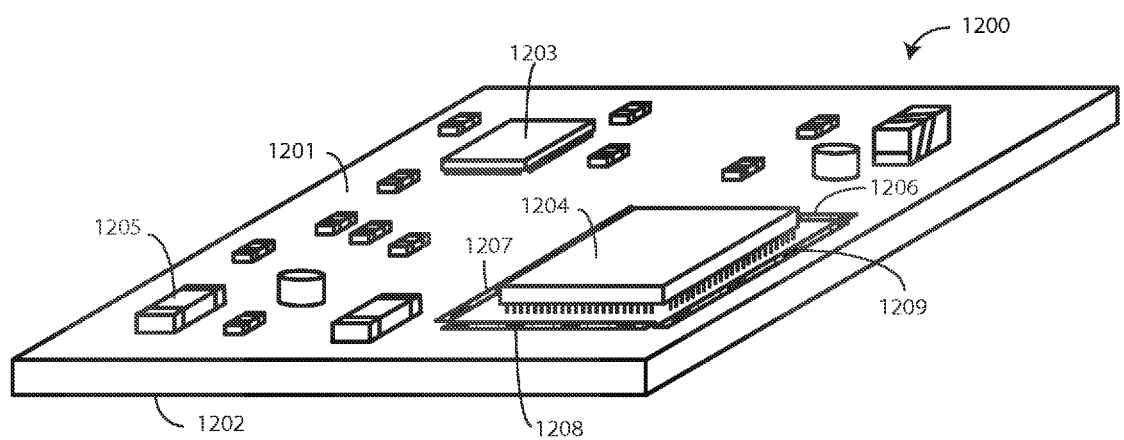
FIG. 12 illustrates an explanatory circuit substrate configured in accordance with one or more embodiments of the disclosure.

Turning now to FIG. 12, illustrated therein is a first circuit substrate 1200. In one embodiment, the first circuit substrate 1200 is a printed circuit board. In one embodiment, the first circuit substrate 1200 is manufactured from multiple layers. Some layers can be selectively placed conductive metal, such as copper or aluminum, while other layers can be insulative. In one or more embodiments, the first circuit substrate 1200 comprises a fiberglass printed circuit board. In another embodiment, the first circuit substrate 1200 is a FR4 printed circuit board.

In one embodiment, the first circuit substrate 1200 defines a first major face 1201 and a second major face 1202. A plurality of electrical components, e.g., electrical components 1203,1204,1205, can be disposed on one or more of the first major face 1201 or the second major face 1202. In FIG. 12, one or more electrical components are shown disposed on, and coupled to, the first major face 1201.

In this illustrative embodiment, a plurality of solder pads 1206,1207,1208,1209 define a perimeter about one of the electrical components 1204. The electrical component 1204 disposed within the perimeter of this explanatory embodiment is an integrated circuit processor. This particular integrated circuit processor is sensitive to electromagnetic energy. Accordingly, one or more substrate bridging members are going to be used as shield walls about the perimeter. Additionally, the one or more substrate bridging members are going to provide increased mechanical strength to the circuit assembly that will ultimately be formed.

Figure 13:
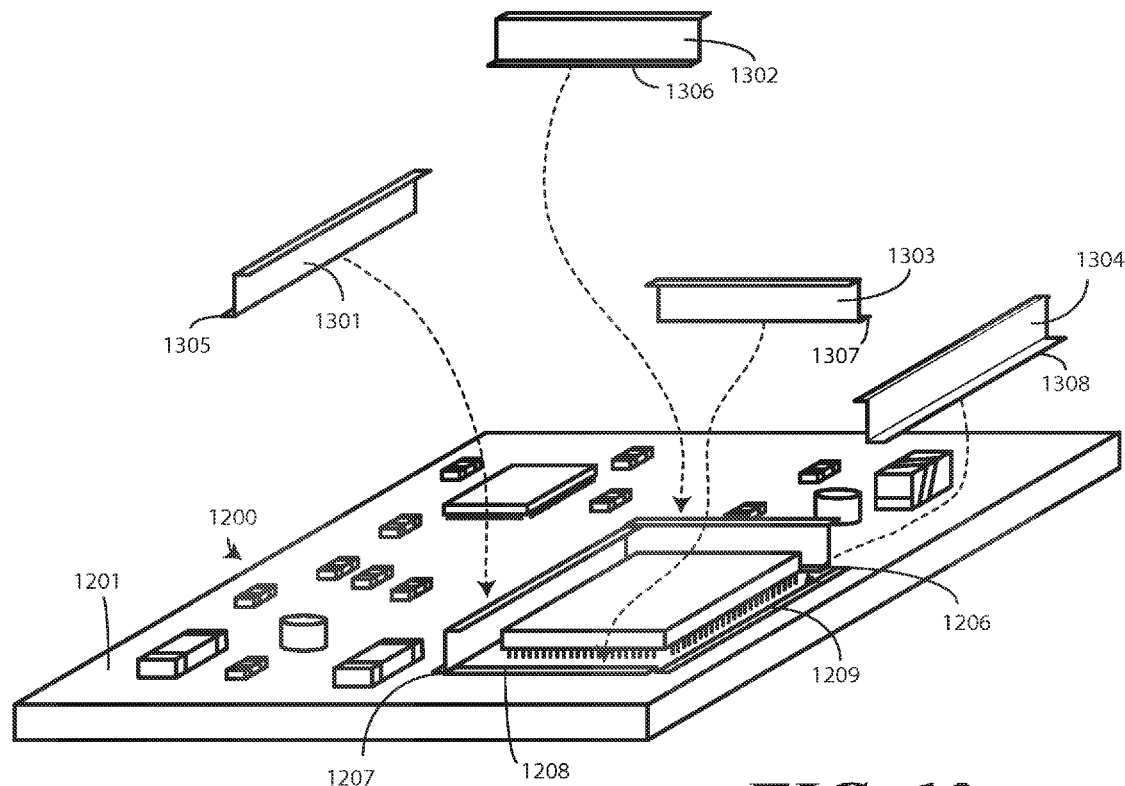
FIG. 13 illustrates explanatory substrate bridging members being applied to an explanatory substrate in accordance with one or more methods of the disclosure.

Turning now to FIG. 13, four substrate bridging members 1301,1302,1303,1304 are being placed on the solder pads 1206,1207,1208,1209. When the first circuit substrate 1200 is passed through a reflow oven, the first ends 1305,1306,1307, 1308 of the substrate bridging members 1301,1302,1303, 1304 will be bonded to the first major face 1201 of the first circuit substrate 1200 when solder paste disposed on the solder pads 1206,1207,1208,1209 solders the first ends 1305, 1306,1307,1308 of the substrate bridging members 1301, 1302,1303,1304 to the solder pads 1206,1207,1208,1209. This is shown in FIG. 14, where the first ends 1305,(1306), (1307),1308 of the substrate bridging members 1301,1302, 1303,1304 have been soldered to the solder pads (1206,1207, 1208,1209) by a reflow process.

Figure 14:
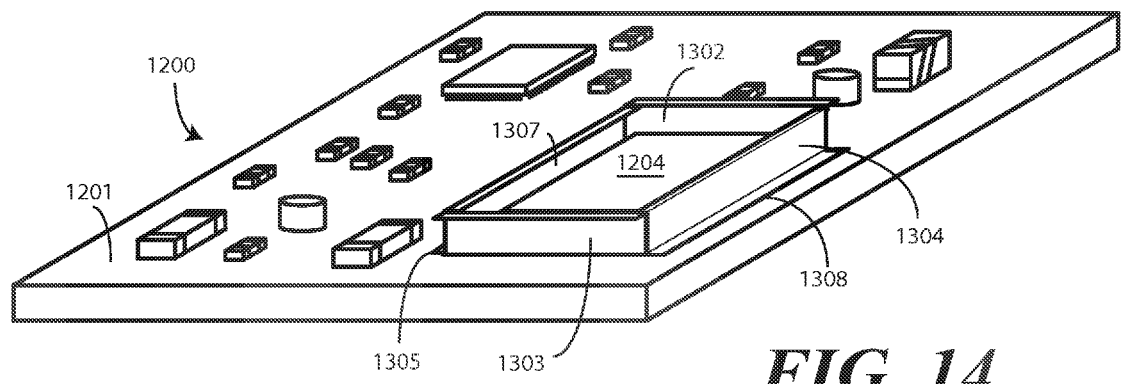
FIG. 14 illustrates an explanatory circuit substrate configured in accordance with one or more embodiments of the disclosure.

As shown in FIG. 14, the substrate bridging members 1301,1302,1303,1304 define a perimeter about the electrical component 1204. In this illustrative embodiment, at least one substrate bridging member, e.g., substrate bridging member 1301, is disposed interior the first circuit substrate 1200 from the electrical component 1204. Said differently, substrate bridging member 1301 is farther toward the interior of the first major face 1201 than is the electrical component 1204, and the electrical component 1204 is nearer the edge than is the substrate bridging member 1301. In this illustrative embodiment, substrate bridging member 1302 is also disposed interior the first circuit substrate 1200 from the electrical component 1204.

Figure 15:
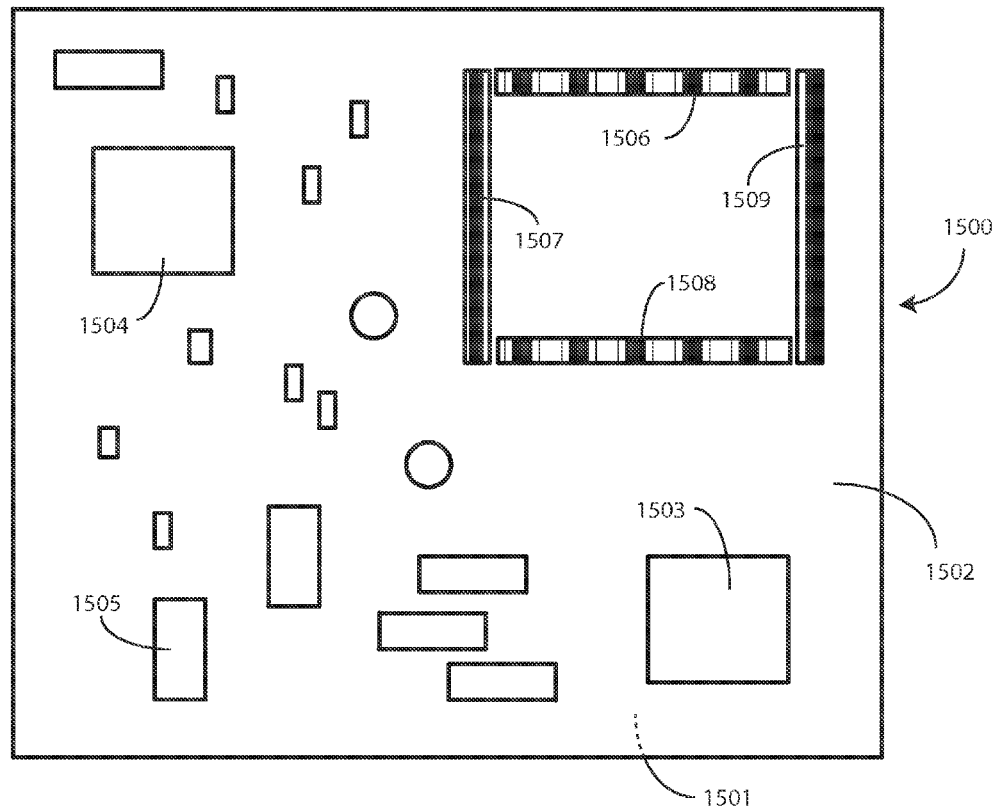
FIG. 15 illustrates an explanatory circuit substrate configured in accordance with one or more embodiments of the disclosure.

Turning now to FIG. 15, illustrated therein is a second circuit substrate 1500. As with the first circuit substrate (1200), in one embodiment, the second circuit substrate 1500 is a printed circuit board. In one embodiment, the second circuit substrate 1500 is manufactured from multiple layers. Some layers can be selectively placed conductive metal, such as copper or aluminum, while other layers can be insulative. In one or more embodiments, the second circuit substrate 1500 comprises a fiberglass printed circuit board. In another embodiment, the second circuit substrate 1500 is a FR4 printed circuit board.

In one embodiment, the second circuit substrate 1500 defines a first major face (shown in FIG. 17) and a second major face 1502. A plurality of electrical components, e.g., electrical components 1503,1504,1505, can be disposed on one or more of the first major face 1501 or the second major face 1502. In the embodiment of FIG. 15, one or more electrical components are shown disposed on, and coupled to, both the first major face (shown in FIG. 17) and the second major face 1502.

In this illustrative embodiment, a plurality of resistive solder assemblies 1506,1507,1508,1509 defines a perimeter. When the second circuit substrate 1500 is placed atop the first circuit substrate (1200), the perimeter will align with the perimeter defined by the substrate bridging members (1301, 1302,1303,1304) about the electrical component (1204) such that the second ends of the substrate bridging members (1301, 1302,1303,1304) seat against the plurality of resistive solder assemblies 1506,1507,1508,1509. When current is passed through the plurality of resistive solder assemblies 1506, 1507,1508,1509, it will cause solder paste disposed on the plurality of resistive solder assemblies 1506,1507,1508,1509 to solder the second ends of the substrate bridging members (1301,1302,1303,1304) to bond to the second major face 1502 of the second circuit substrate 1500 via a resistive heat soldering process.

Figure 16:
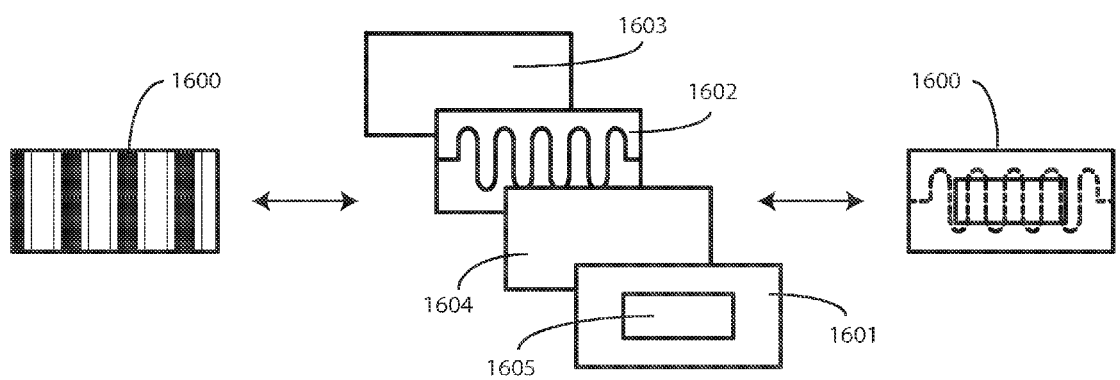
FIG. 16 illustrates an explanatory solder pad and resistive element assembly in accordance with one or more embodiments of the disclosure.

Turning now to FIG. 16, illustrated therein is an explanatory embodiment of a resistive solder assembly 1600 in accordance with one or more embodiments of the disclosure. The resistive solder assembly 1600 can be attached to a major face of one or both of the first circuit substrate (1200) or the second circuit substrate (1500). In one or more embodiments, the resistive solder assembly 1600 is integral to one or both of the first circuit substrate (1200) or the second circuit substrate (1500). For example, components of the resistive solder assembly 1600 can be formed along layers of one or both of the first circuit substrate (1200) or the second circuit substrate (1500).

In one embodiment, the resistive solder assembly 1600 comprises a solder pad 1601 aligned with a resistive element 1602. One or more electrically insulating layers 1603,1604 can be disposed between the solder pad 1601 and the resistive element 1602. When current is applied to the resistive element 1602, it heats, thereby melting solder paste 1605 disposed on the solder pad 1601. When an end of a substrate bridging member abuts the solder pad 1601 and sufficient current is passed through the resistive element 1602, the end becomes soldered to the solder pad 1601. It should be noted that bonding methods other soldering with resistive solder assemblies 1600 could be used. Illustrating by example, gluing substrate bridging members can be used in some embodiments as noted above. Additionally, where soldering is used, the use resistive solder assemblies 1600 is but one technique for attaching the second substrate to the first substrate. Instead of resistive solder assemblies 1600, one may solder by applying heat to the solder pad 1601 through a hole in the substrate, by laser welding, or by other techniques. Other bonding techniques will be obvious to those of ordinary skill in the art having the benefit of this disclosure.

In one embodiment, the resistive solder assembly 1600 heats to about 600 degrees centigrade when current is passed through the resistive element 1602. In one embodiment, the resistive element 1602 is not electrically coupled to the solder pad 1601; it is instead thermally coupled to the solder pad 1601. This can be accomplished by electrically coupling the solder pad 1601 to a ground plane and placing an electrically insulating layer 1604 between the solder pad 1601 and the resistive element 1602. When the resistive element 1602 warms, heat is transferred to the solder pad 1601 to melt the solder paste 1605.

Figure 17:
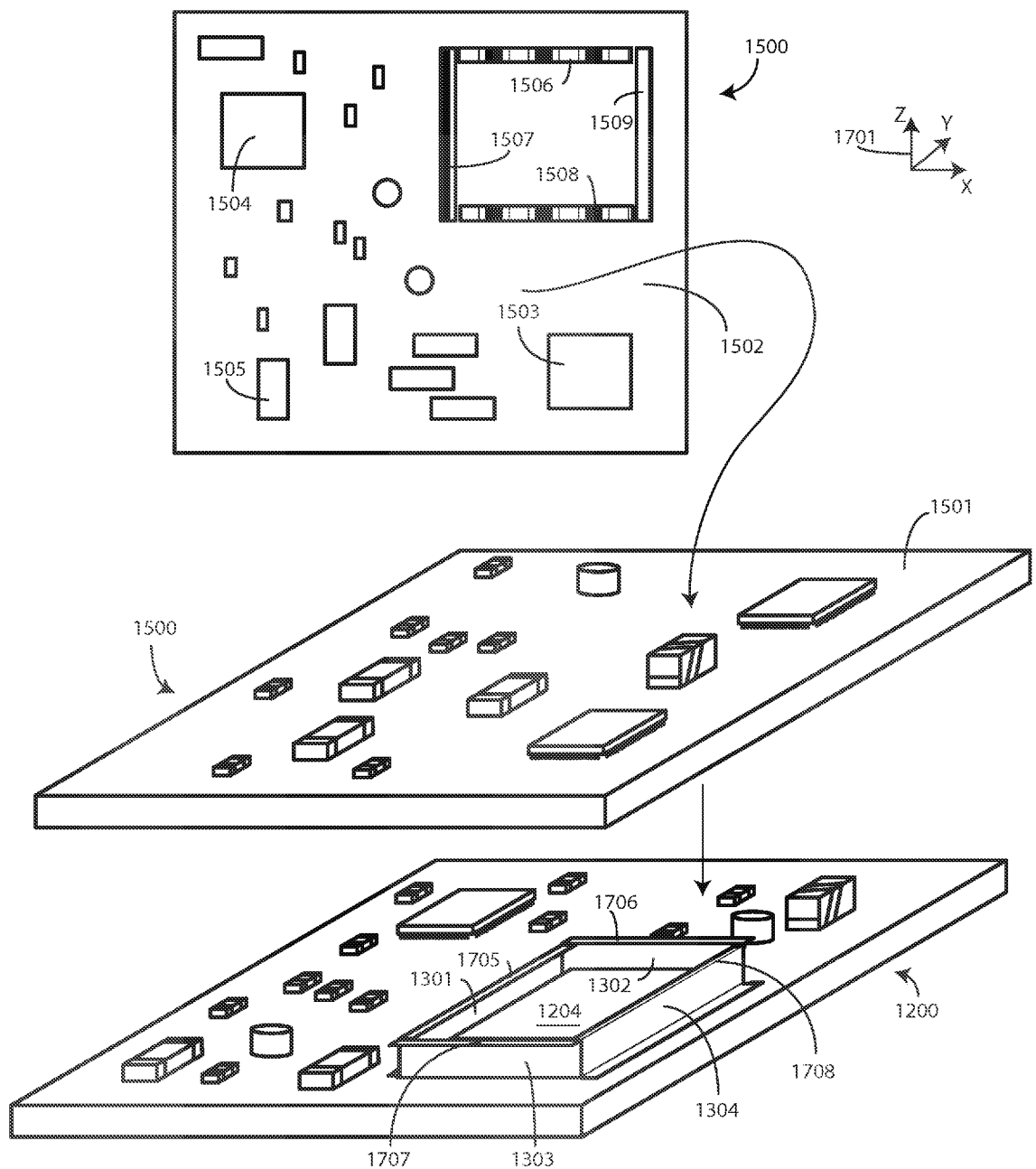
FIG. 17 illustrates one or more assembly methods for a circuit assembly in accordance with one or more embodiments of the disclosure.

The resistive solder assembly 1600 of FIG. 16 provides one of the significant advantages offered by embodiments of the disclosure. This advantage is that the honeycomb structure can be formed using only a single reflow process. Turning now to FIG. 17, recall that the first ends (1305,1306,1307, 1308) of the substrate bridging members 1301,1302,1303, 1304 have been soldered to the solder pads (1206,1207,1208, 1209) by a reflow process. The second circuit substrate 1500 is then aligned with the first circuit substrate 1200 such that the perimeter defined by the plurality of resistive solder assemblies 1506,1507,1508,1509 will align with the perimeter defined by the substrate bridging members 1301,1302, 1303,1304 about the electrical component 1204 along the z-axis 1701.

When the first circuit substrate 1200 and the second circuit substrate 1500 are pressed together, the second ends 1705, 1706,1707,1708 of the substrate bridging members 1301, 1302,1303,1304 seat against the plurality of resistive solder assemblies 1506,1507,1508,1509. When current is passed through the plurality of resistive solder assemblies 1506, 1507,1508,1509, it will cause solder paste (1605) disposed on the plurality of resistive solder assemblies 1506,1507,1508, 1509 to solder the second ends 1705,1706,1707,1708 of the substrate bridging members 1301,1302,1303,1304 to bond to the second major face 1502 of the second circuit substrate 1500 via a resistive heat soldering process.

Were the plurality of resistive solder assemblies 1506,1507,1508,1509 not used, reflowing the assembly in an attempt to cause solder paste (1605) disposed on the plurality of resistive solder assemblies 1506,1507,1508,1509 to solder the second ends 1705,1706,1707,1708 of the substrate bridging members 1301,1302,1303,1304 may risk dislodging the electrical components 1503,1504,1505 from the second major face 1502 of the second circuit substrate 1500. Additionally, the fact that a second reflow process is not required to attach the second circuit substrate 1500 to the second ends 1705,1706,1707,1708 of the substrate bridging members 1301,1302,1303,1304, embodiments of the disclosure advantageously provide for tighter tolerances along the z-axis 1701. Said differently, the distance between the first substrate 1200 and the second circuit substrate 1500 along the z-axis 1701 can be more tightly controlled using the resistive solder assemblies 1506,1507,1508,1509 than with a second reflow process. The tolerances can be even tighter when the assembly is placed in a fixture during the attachment of the first substrate 1200 to the second circuit substrate 1500, as the fixture can precisely align the first substrate 1200 and the second circuit substrate 1500 while the resistive solder assemblies 1506,1507,1508,1509 heat. The resulting circuit assembly 1800 is shown in FIG. 18.

Figure 18:
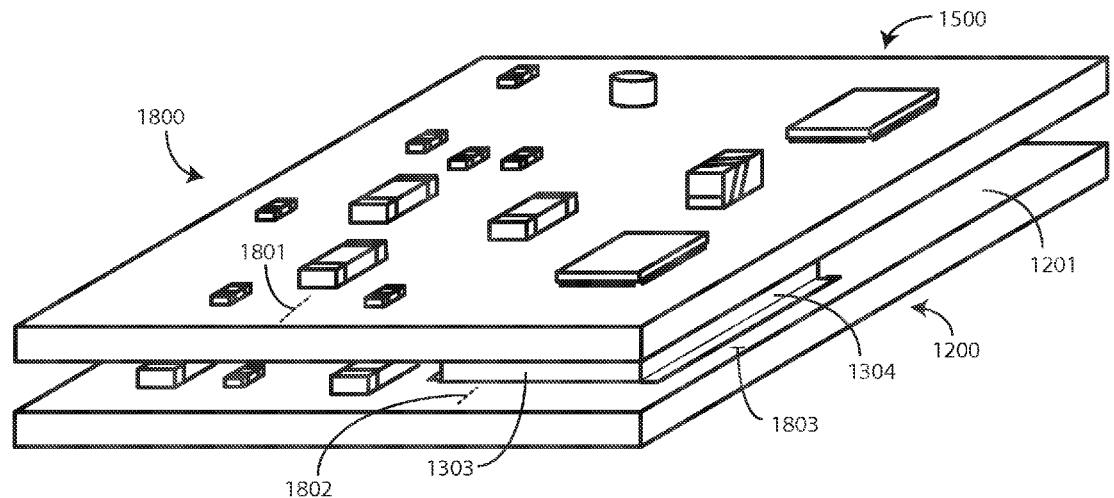
FIG. 18 illustrates an explanatory circuit assembly in accordance with one or more embodiments of the disclosure.

As shown in FIG. 18, the circuit assembly 1800 comprises the first circuit substrate 1200 and the second circuit substrate 1500. The first circuit substrate 1200 defines a first side of the circuit assembly 1800, while the second circuit substrate 1500 defines a second side of the circuit assembly 1800. At least one electrical component is disposed on at least one of the first circuit substrate 1200 or the second circuit substrate 1500 interior 1801 to the circuit assembly 1800. In this embodiment, electrical components are disposed on both major faces of the first circuit substrate 1200 and both major faces of the second circuit substrate 1500. As shown, one or more unitary shield elements, in this embodiment the substrate bridging members (1301),(1302),1303,1304, are disposed interior 1802,1803 to the circuit assembly 1800 and have a first end soldered to the first circuit substrate 1200 and a second end soldered to the second circuit substrate 1500. Each substrate bridging member (1301),(1302),1303,1304, defines a unitary structure having a first end bonded to the first major face 1201 and a second end bonded to the second major face (1502) to bridge the first circuit substrate 1200 and the second circuit substrate 1500. As noted in the discussion of FIGS. 12-17, in this illustrative embodiment at least one substrate bridging member, e.g., substrate bridging member 1304, has a first end bonded to the solder pad (1209) on one major face and a second end bonded to a resistive solder assembly (1509) to bridge the first circuit substrate 1200 and the second circuit substrate 1500.

In this embodiment, the plurality of substrate bridging members (1301),(1302),1303,1304, are disposed across the first major face 1201 of the first circuit substrate 1200 and the second major face (1502) of the second circuit substrate 1500 to orient the first circuit substrate 1200 substantially parallel to the second circuit substrate 1500. As will be seen in the discussion of FIG. 22, the circuit substrates need not always be parallel at all points. However, in this embodiment, the entirety of the first circuit substrate 1200 is substantially parallel with the entirety of the second circuit substrate 1500. The term "substantially" is used to mean a dimension or orientation that is inclusive of manufacturing tolerances. Accordingly, where the substrate bridging members (1301), (1302),1303,1304, are to be the same height, but have manufacturing tolerances that make them slightly different heights, they will still orient the first circuit substrate 1200 and the second circuit substrate 1500 in a substantially parallel orientation.

Figure 19:
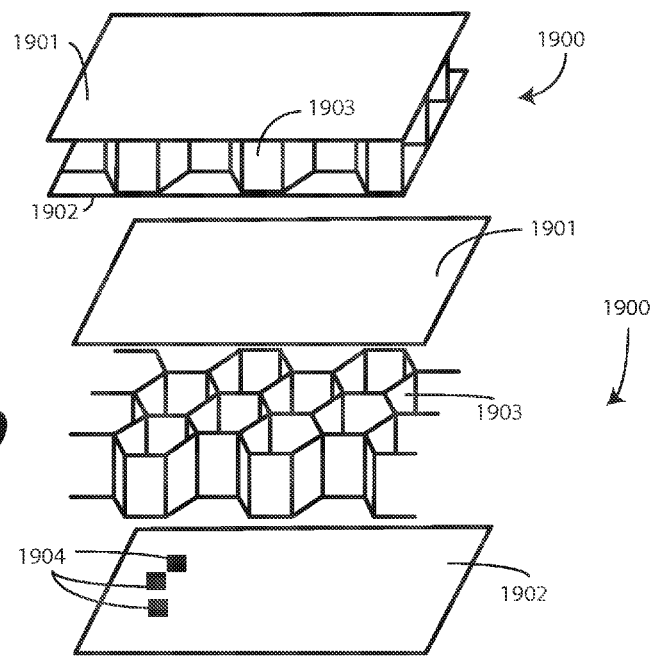
FIG. 19 illustrates an alternate circuit assembly in accordance with one or more embodiments of the disclosure.

Turning now to FIG. 19, illustrated therein is an alternate circuit assembly 1900, shown both assembled and in an exploded view. As noted above, any number of shield elements can be disposed along a substrate to provide electromagnetic shielding and/or mechanical support. In FIG. 19, a network 1903 of shield elements is disposed between a first substrate 1901 and a second substrate 1902. The network 1903 of shield elements can be a plurality of independent, unitary shield elements that are placed on the first substrate 1901 as previously described in one embodiment. Alternatively, in another embodiment independent, unitary shield elements can be attached to each other to form the network 1903 prior to placing the network 1903 on the first substrate 1901.

The circuit assembly 1900 of FIG. 19 comprises the first substrate 1901, which defines a first side of the circuit assembly 1900 and the second substrate 1902, which defines a second side of the circuit assembly 1900. At least one electrical component 1904 is disposed on at least one of the first substrate 1901 or the second substrate 1902 interior to the circuit assembly 1900. Additionally, the network 1903 of shield elements comprises one or more unitary shield elements disposed interior to the circuit assembly 1900 and having a first end soldered to the first substrate 1901 and a second end soldered to the second substrate 1902. The circuit assembly 1900 of FIG. 19 allows a designer to "stack" substrates "back-to-back" to get a density increase within an electronic device into which the circuit assembly 1900 is placed. At the same time, the network 1903 of shield elements, which resembles a true honeycomb in this embodiment, provides an improved and advantageous mechanical structure that is resistant to damage from externally applied mechanical forces.

Where one of the first substrate 1901 or the second substrate 1902 includes resistive solder assemblies (1600), the circuit assembly 1900 of FIG. 19 is also easily manufacturable. This is true despite the large number of shield elements forming the network 1903. When using resistive solder assemblies (1600), rather than using multiple reflow processes or many cumbersome hot plates in manufacture, one simply applies a current to the resistive solder assemblies (1600) to cause the network 1903 of shield elements to solder to a substrate. The current can be applied through vias in one of the substrates for convenient and easy manufacture. The use of resistive solder assemblies (1600) is not the only way to manufacture the circuit assembly 1900, however. Other methods will be obvious to those of ordinary skill in the art having the benefit of this disclosure. For example, if one wanted to use hot plates, they could apply heat to one of the substrates through hole openings in the substrate, through inductive or resistive heating methods, or by applying heat to thermally conductive traces running to solder pads on one of the substrates. It should be noted that when reworking the circuit assembly 1900 for service, one of the substrates may be removed in the same manner as it was placed.

Figure 20:
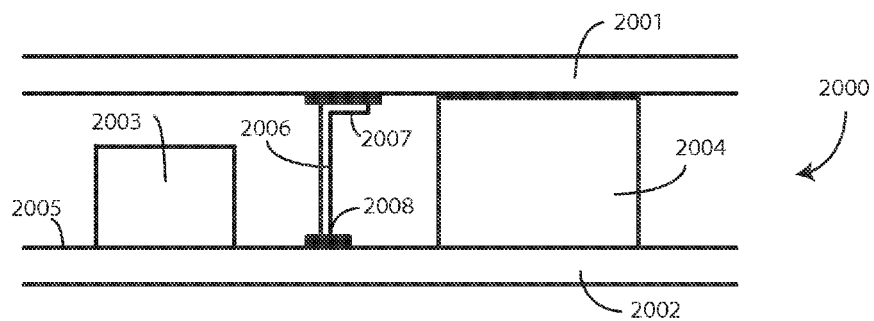
FIG. 20 illustrates a sectional view of one explanatory circuit assembly in accordance with one or more embodiments of the disclosure.

Turning now to FIGS. 20-23, illustrated therein are sectional views of alternate embodiments of circuit assemblies 2000,2100,2200 in accordance with one or more embodiments of the disclosure. Beginning with FIG. 20, illustrated therein is a "basic" circuit assembly 2000. As shown, a first substrate 2001 defines a first side of the circuit assembly 2000. A second substrate 2002 defines a second side of the circuit assembly 2000. Electrical components 2003,2004 are disposed along a major face 2005 of the second substrate 2002. One or more substrate bridging members 2006 are disposed interior to the circuit assembly 2000 and have a unitary structure. A first end 2007 is soldered to the first substrate 2001 and a second end 2008 is soldered to the second substrate 2002. As shown in this embodiment, at least one of the one or more substrate bridging members 2006 is disposed interior to the electrical components 2003,2004. As noted above, the one or more substrate bridging members 2006 can be used to electromagnetically shield at least one of the electrical components 2003,2004.

Figure 21:
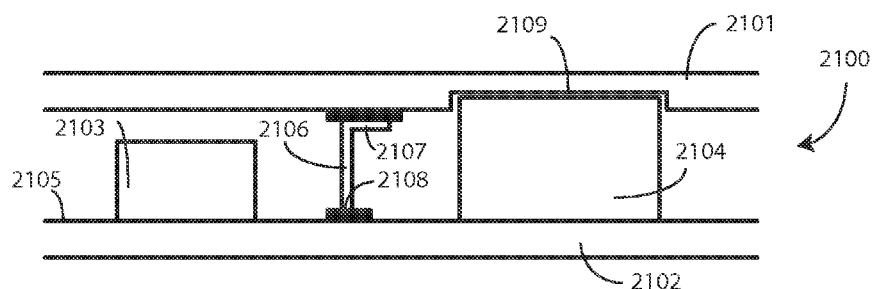
FIG. 21 illustrates a sectional view of a circuit assembly in accordance with one or more embodiments of the disclosure.
Figure 22:
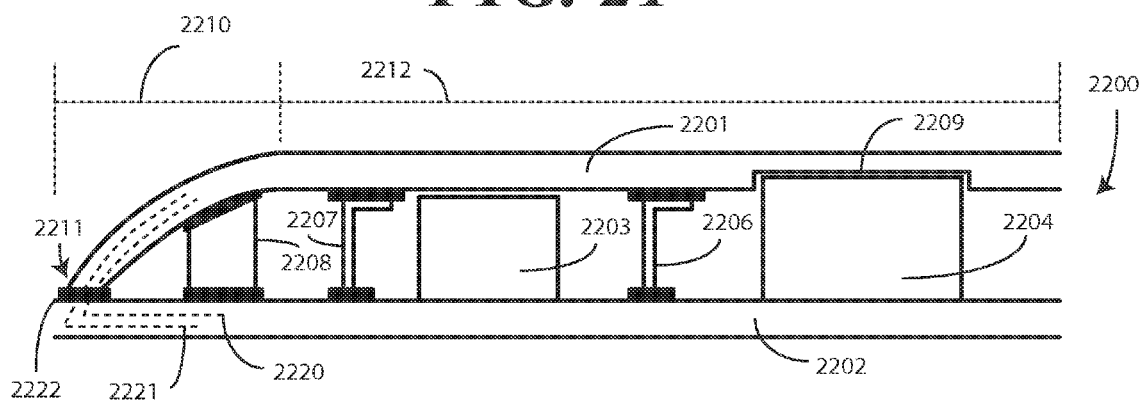
FIG. 22 illustrates a sectional view of another circuit assembly in accordance with one or more embodiments of the disclosure.

Turning now to FIG. 21, illustrated therein is an alternate circuit assembly 2100. As with FIG. 20, a first substrate 2101 defines a first side of the circuit assembly 2100. A second substrate 2102 defines a second side of the circuit assembly 2100. Electrical components 2103,2104 are disposed along a major face 2105 of the second substrate 2102. One or more substrate bridging members 2106 are disposed interior to the circuit assembly 2100 and have a unitary structure. A first end 2107 is soldered to the first substrate 2101 and a second end 2108 is soldered to the second substrate 2102.

In this embodiment, one electrical component 2104 is taller than another electrical component 2103. To further increase overall density of the circuit assembly 2100, the first substrate 2101 defines a recess 2109 that receives at least a portion of electrical component 2104. Said differently, at least a portion of the taller electrical component, i.e., electrical component 2104, extends into the recess 2109. In one or more embodiments, the recess 2109 allows the first substrate 2101 to effectively touch electrical component 2104 when the outer layer of the recess 2109 is insulating, e.g., fiberglass of a printed circuit board, due to the fact that there is no electrical connection between the recess 2109 and the electrical component 2204 in such an embodiment.

The recess 2109 can be formed in a variety of ways. In one embodiment, the recess 2109 is formed by removing material from the first substrate 2101 in areas corresponding to taller components, i.e., areas above electrical component 2104. In another embodiment, layers of the first substrate 2101 can be cut out before it is assembled. Other methods will be obvious to those of ordinary skill in the art having the benefit of this disclosure.

Turning now to FIG. 22, illustrated therein is yet another an alternate circuit assembly 2200. A first substrate 2201 defines a first side of the circuit assembly 2200. A second substrate 2202 defines a second side of the circuit assembly 2200. Electrical components 2203,2204 are disposed along a major face 2205 of the second substrate 2202. One or more substrate bridging members 2206,2207,2208 are disposed interior to the circuit assembly 2200 and each have a unitary structure. The ends of each substrate bridging member 2206,2207,2208 are coupled as before, with a first end soldered to the first substrate 2201 and a second end soldered to the second substrate 2202.

As with FIG. 21, one electrical component 2204 is taller than another electrical component 2203. To further increase overall density of the circuit assembly 2200, the first substrate 2201 defines a recess 2209 that receives at least a portion of electrical component 2204.

In the embodiment of FIG. 22, the first substrate 2201 is deformed in an outer region 2210. In this embodiment, the first substrate 2201 is deformed to bond to the second substrate 2202 at the edge 2211 of the circuit assembly 2200. At the same time, at least a portion 2212 of the first substrate 2201 and the second substrate 2202 are oriented substantially parallel.

The deformation can be achieved in a variety of ways. In one embodiment, the deformed substrate is heated and sent through a forming process to cause the deformation. Other methods will be obvious to those of ordinary skill in the art having the benefit of this disclosure. In one embodiment, the deformation is applied along only a single axis, or along parallel axes. For example, the edge 2211 of the circuit assembly 2200 shown in FIG. 22 has a corresponding edge on an opposite side. Both sides could be bent along axes running into the page. This would be an example of parallel axis deformation.

In one or more embodiments, this deformation serves a variety of functions. First, as will be described with reference to FIG. 37, the deformed portion can allow an electronic device to have a form factor with rounded sides. Second, bonding the first substrate 2201 to the second substrate 2202 increases mechanical strength of the circuit assembly 2200 where it does the most good, i.e., at the edge 2211 of the circuit assembly 2200. Using a conformal board generally allows more mechanical strength without affecting the overall mechanical design. Moreover, placing at least one vertical wall (substrate bridging member 2208) on the outside of the circuit assembly 2200 increases strength as well. If someone drops an electronic device including the circuit assembly 2200 on its edge, energy will translate through the various substrate bridging members 2206,2207.2208 before it gets to more sensitive components, thereby reducing the chance for damage to those components.

Yet another advantage includes the elimination of connectors, flex circuits, or other interconnection devices between the first substrate 2201 and the second substrate 2202 in some embodiments. For example, in one embodiment, electrical conductors 2220 coupled to power or ground, or electrical conductors 2221 carrying data signals or analog signals, can be disposed in or on the layers forming the first substrate 2201 and the second substrate 2202. These electrical conductors 2220,2221 can connect through a connection 2222 disposed at the edge 2211 of the circuit assembly 2200, thereby eliminating the need to include flexible circuits, wires, connectors, or other power/data communication lines between the first substrate 2201 and the second substrate 2202.

Figure 23:
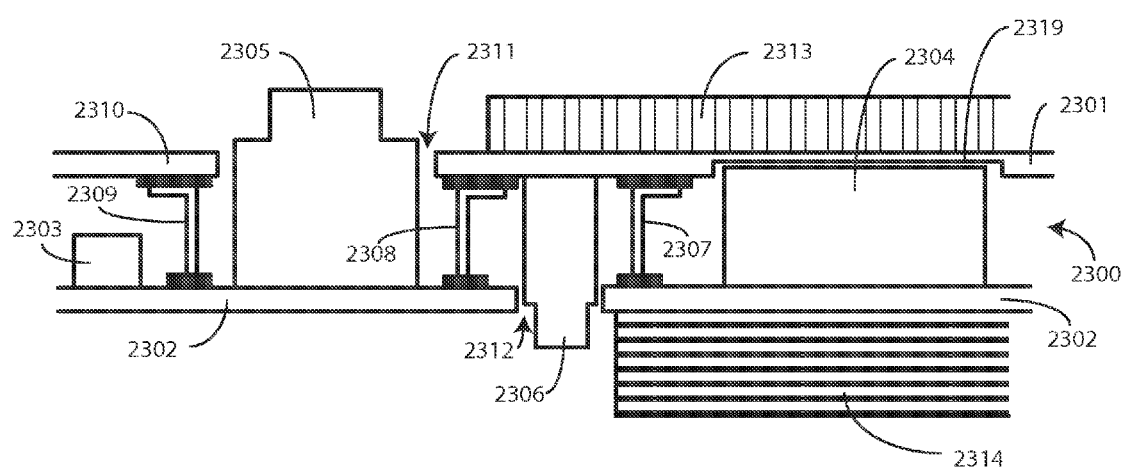
FIG. 23 illustrates a sectional view of another circuit assembly in accordance with one or more embodiments of the disclosure.

Turning now to FIG. 23, illustrated therein is yet another circuit assembly 2300 configured in accordance with embodiments of the disclosure. A first substrate 2301 defines a first side of the circuit assembly 2300. A second substrate 2302 defines a second side of the circuit assembly 2300. Electrical components 2303,2304,2305,2306 are disposed along major faces both substrates. One or more substrate bridging members 2307,2308,2309 are disposed interior to the circuit assembly 2300. The ends of each substrate bridging member 2307,2308,2309 are coupled as before, with a first end soldered to the first substrate 2301 and a second end soldered to the second substrate 2302.

As with FIG. 21, one electrical component 2304 is taller than another electrical component 2303. To further increase overall density of the circuit assembly 2300, the first substrate 2301 defines a recess 2319 that receives at least a portion of electrical component 2304.

Other electrical components 2305,2306 are taller still. In this explanatory embodiment, the other electrical components 2305,2306 are imagers that receive light through a lens. Accordingly, affording them a recess as with electrical component 2304 would not work. To accommodate these other electrical components 2305,2306 without sacrificing density, both the first substrate 2301 and the second substrate 2302 each define an aperture 2311,2312. Electrical components 2305,2306 can then extend through their corresponding apertures 2311,2312.

The illustrative embodiment of FIG. 23 also includes other components to form a more complete circuit assembly 2300. In one embodiment, a display 2313, operable with the circuit assembly 2300, is attached to the first substrate 2301. Additionally, a battery 2314, also operable with the circuit assembly 2300, is attached to the second substrate 2302 on a side of the circuit assembly opposite the display 2313. These components can be attached to the substrates in a variety of ways. Illustrating by example, in one embodiment they are simply adhesively attached, such as by double sided adhesive. Other methods of attaching these components to the substrates will be obvious to those of ordinary skill in the art having the benefit of this disclosure. For example, thermal compression pads having adhesive sides can be disposed between the components, or spacers could be disposed between the components. In one embodiment, the result is a solid, laminated structure.

Note that while two circuit substrates 2301,2302 are shown in FIG. 23 and other embodiments for ease of illustration, it should be noted that more substrates can be added with substrate bridging members disposed between the circuit assembly 2300 of FIG. 23 and those additional substrates. Three, four, five, or more substrates can be honeycombed together as needed by a particular application. Additionally, to create additional stability in a system, some components, such as the battery 2314 can be segmented with substrate bridging members interposed between the battery segments to add increased mechanical stability to the system.

Embodiments of the disclosure contemplate that once shield elements or substrate bridging members are incorporated into a circuit assembly, some of these shield elements or substrate bridging members can be used for functions other than simply shielding or providing mechanical support. Components can be placed on the vertical elements. Radiators or antennas can be defined in the vertical elements. Connectors can be incorporated into the vertical elements. Acoustic devices can be incorporated into the vertical elements. This is just a few of the number of functions that can be assigned to the shield elements or substrate bridging members configured in accordance with embodiments of the disclosure. Turning now to FIGS. 24-30, illustrated are some examples. Other examples will be obvious to those of ordinary skill in the art having the benefit of this disclosure.

Figure 24:
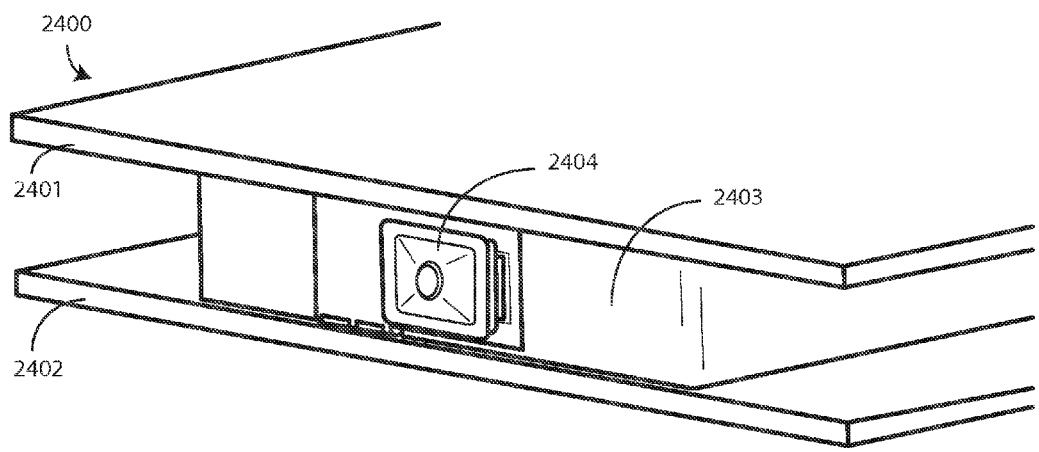
FIG. 24 illustrates a sectional view of another circuit assembly in accordance with one or more embodiments of the disclosure.

Beginning with FIG. 24, a circuit assembly 2400 includes a first substrate 2401 defining a first side of the circuit assembly 2400 and a second substrate 2402 defining a second side of the circuit assembly 2400. As with previous embodiments, one or more substrate bridging members 2403 are disposed interior to the circuit assembly 2400 and have a unitary structure with a first end soldered to the first substrate 2401 and a second end soldered to the second substrate 2402.

In this illustrative embodiment, a circuit element 2404 is disposed along at least one substrate bridging member 2403. The circuit element 2404 can be operable with electrical or electronic components disposed on one or more of the first substrate 2401 and the second substrate 2402. In this embodiment, for illustrative purposes, the circuit element 2404 is shown as a push button switch. However, it could be other elements as well. For example, the circuit element 2404 could be a light emitting diode, a sensor, or other components.

Figure 25:
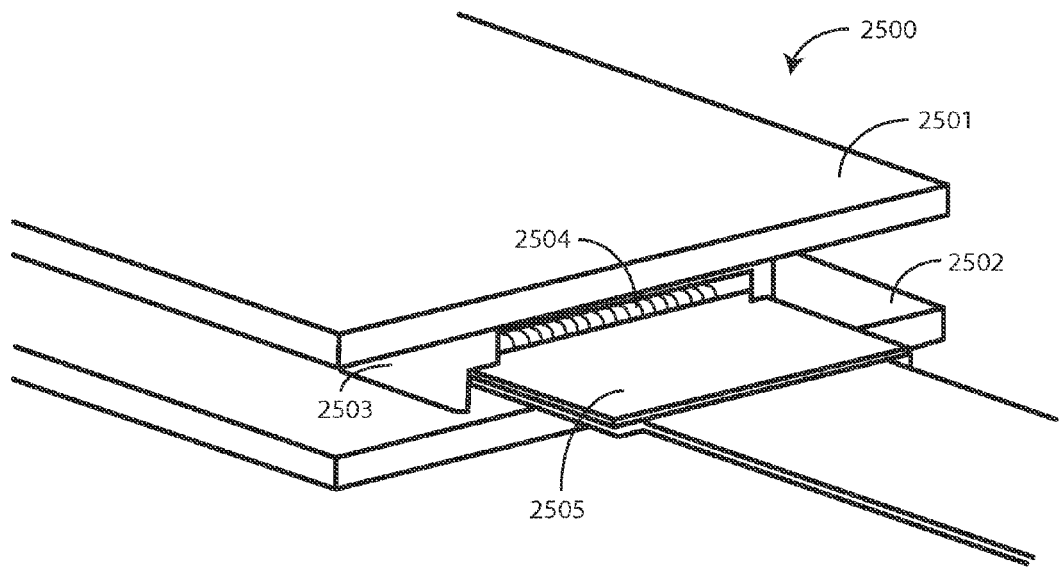
FIGS. 25-26 illustrate a sectional view of another circuit assembly in accordance with one or more embodiments of the disclosure.
Figure 26:
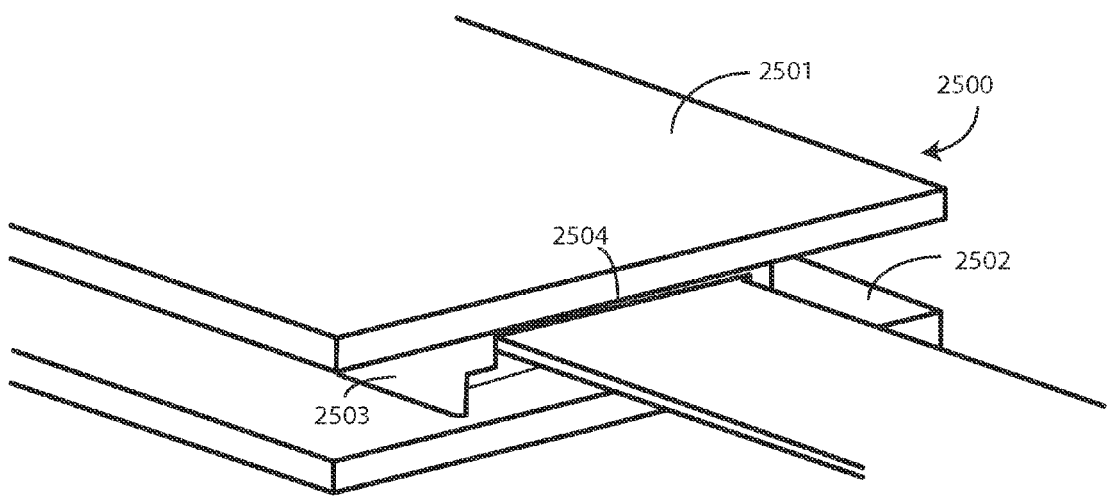

Turning to FIGS. 25-26, a circuit assembly 2500 includes a first substrate 2501 defining a first side of the circuit assembly 2500 and a second substrate 2502 defining a second side of the circuit assembly 2500. As with previous embodiments, one or more substrate bridging members 2503 are disposed interior to the circuit assembly 2500 and have a unitary structure with a first end soldered to the first substrate 2501 and a second end soldered to the second substrate 2502.

In this illustrative embodiment, another circuit element 2504 is disposed along at least one substrate bridging member 2503. The circuit element 2504 can be operable with electrical or electronic components disposed on one or more of the first substrate 2501 and the second substrate 2502. In this embodiment, for illustrative purposes, the circuit element 2504 is shown as an electrical connector 2505.

Figure 27:
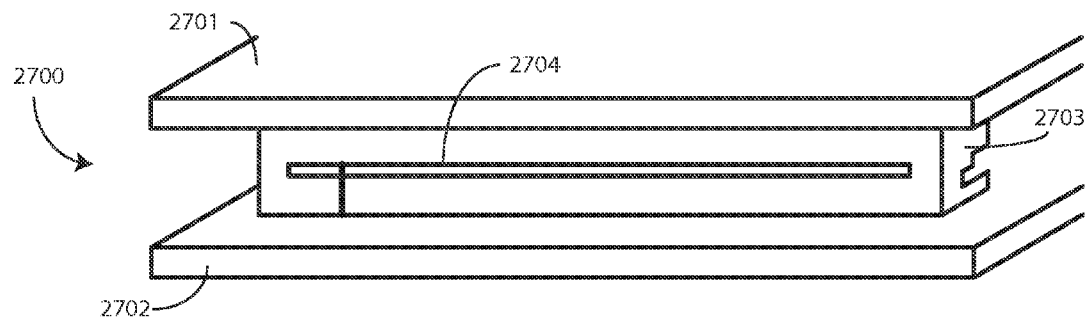
FIG. 27 illustrates a sectional view of another circuit assembly in accordance with one or more embodiments of the disclosure.

Turning to FIG. 27, a circuit assembly 2700 includes a first substrate 2701 defining a first side of the circuit assembly 2700 and a second substrate 2702 defining a second side of the circuit assembly 2700. As with previous embodiments, one or more substrate bridging members 2703 are disposed interior to the circuit assembly 2700 and have a unitary structure with a first end bonded to the first substrate 2701 and a second end bonded to the second substrate 2702.

In one or more embodiments, the substrate bridging member 2703 is defines an electromagnetic radiating element. In this illustrative embodiment, the substrate bridging member 2703 defines a slot antenna 2704. The substrate bridging member 2703 could define other types of antennas as well, including conformal antennas, inverted antennas, inverted-F antennas, and so forth.

Figure 28:
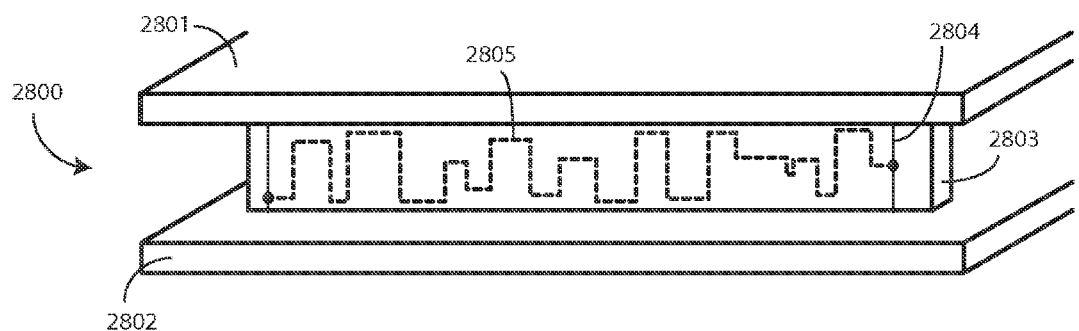
FIG. 28 illustrates a sectional view of another circuit assembly in accordance with one or more embodiments of the disclosure.

Turning to FIG. 28, a circuit assembly 2800 includes a first substrate 2801 defining a first side of the circuit assembly 2800 and a second substrate 2802 defining a second side of the circuit assembly 2800. As with previous embodiments, one or more substrate bridging members 2803 are disposed interior to the circuit assembly 2800 and have a unitary structure with a first end bonded to the first substrate 2801 and a second end bonded to the second substrate 2802.

As with FIG. 27, the substrate bridging member 2803 comprises an electromagnetic radiating element. However, the electromagnetic radiating element is configured differently. In this embodiment, another circuit substrate 2804 spans the substrate bridging member 2803. The other circuit substrate 2804 can be, in one embodiment, a flexible circuit substrate having flexible layers encapsulating, having disposed thereon, or combinations thereof, electrical conductors. An electromagnetic radiating element 2805, shown here as a conductive trace disposed along the other circuit substrate 2804, serves as the radiating element.

As an alternative to placing the another circuit substrate 2804 along the substrate bridging member 2803, in other embodiments the substrate bridging member 2803 can be manufactured from a non-conductive material, such as plastic. Were this the case in FIG. 28, the radiating element 2805 could be plated directly on the substrate bridging member 2803. Alternatively, the radiating element 2805 could comprise a wire that is insert molded into a plastic substrate bridging member 2803 in another embodiment.

Figure 29:
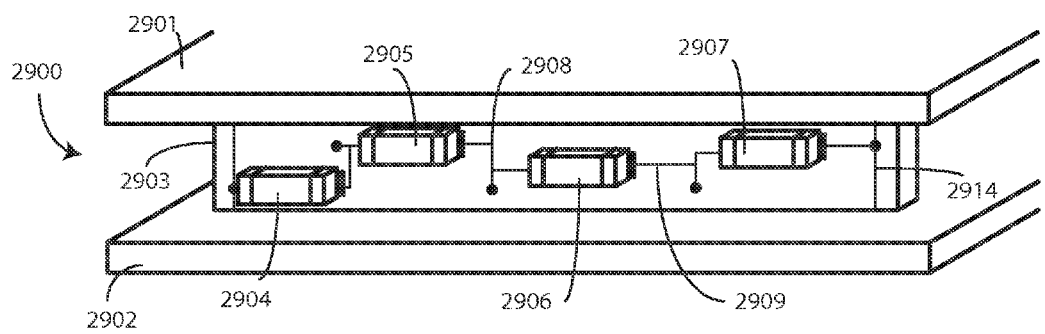
FIG. 29 illustrates a sectional view of another circuit assembly in accordance with one or more embodiments of the disclosure.

Turning to FIG. 29, a circuit assembly 2900 includes a first substrate 2901 defining a first side of the circuit assembly 2900 and a second substrate 2902 defining a second side of the circuit assembly 2900. As with previous embodiments, one or more substrate bridging members 2903 are disposed interior to the circuit assembly 2900 and have a unitary structure with a first end bonded to the first substrate 2901 and a second end bonded to the second substrate 2902.

As with FIG. 28, the substrate bridging member 2903 comprises another circuit substrate 2914 spanning the substrate bridging member 2903. The other circuit substrate 2914 can be, in one embodiment, a flexible circuit substrate. In this illustrative embodiment, one or more circuit elements 2904, 2905, 2906, 2907 are disposed on the other circuit substrate 2914. In one embodiment, the one or more circuit elements 2904, 2905, 2906, 2907 comprises circuit components, and in particular are 0201 surface mount components that can be resistors, capacitors or other devices. The surface mount components are soldered to the other circuit substrate 2914 in this embodiment, and are electrically coupled to other components of the circuit assembly 2900 by one or more conductive traces 2908 and/or vias 2909. Note that the one or more conductive traces 2908 and/or vias 2909 can be used to electrically couple circuit components on the first substrate 2901 to other circuit components on the second substrate 2902 as well. Accordingly, using embodiments of the disclosure, a designer can actually place electrical components on six surfaces of a circuit assembly, rather than two as was the case with prior art circuit boards. In one or more embodiments, the other substrate 2914 is simply a coupler between the circuit substrates. In one embodiment, the other substrate 2914 is not attached to the substrate bridging member 2903; the substrate bridging member 2903 merely provides mechanical support for the other substrate 2914. In one embodiment, the other substrate 2914 is effectively a "curtain" between the first substrate 2901 and the second substrate 2902.

Figure 30:
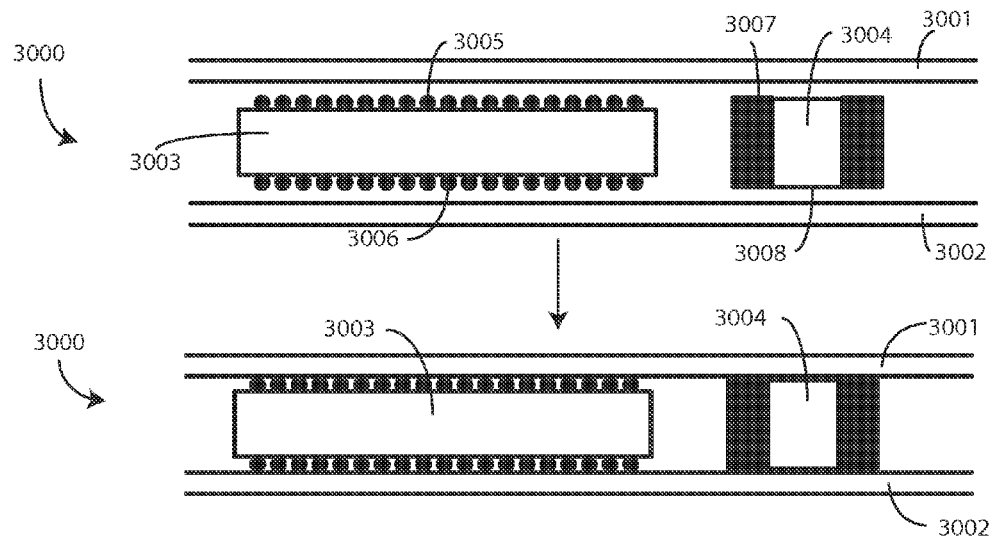
FIG. 30 illustrates a sectional view of another circuit assembly in accordance with one or more embodiments of the disclosure.

Turning now to FIG. 30, an interior cross section of one explanatory circuit assembly 3000 is shown. One or more substrate bridging members may be disposed exterior to the electrical components 3003, 3004 as previously described. Such one or more substrate bridging members are not shown in FIG. 30 for simplicity.

FIG. 30 provides an illustration of how density can be further increased in one or more circuit assemblies 3000 configured in accordance with one or more embodiments of the disclosure. In FIG. 30, the two electrical components 3003, 3004 are coupled to both the first substrate 3001 and the second substrate 3002. Electrical component 3003 is a "ball grid array" or "BGA" component having the at least one electrical component comprising a first ball grid array 3005 coupled to a major face of the first substrate 3001 and a second ball grid array 3006 coupled to a major face of the second substrate 3002. Electrical component 3004 is not a BGA component, but likewise has a first side 3007 coupled to the first substrate 3001 and a second side 3008 coupled to the second substrate 3002.

Coupling electrical components 3003,3004 to both substrates 3001,3002 offers several advantages. First and foremost, it increases density. Second, by coupling components to multiple substrates, mechanical strength and resistance to external forces is increased. Third, by establishing a predetermined distance between the first substrate 3001 and the second substrate 3002, such as 1.5 millimeters, components can be designed to "fill up" that space to further increase density and mechanical strength. Looking farther down the road, parallel substrates set at a predetermined distance apart can standardize the industry so that components become tailored to that size to provide additional mechanical strength. Fourth, attaching components to multiple substrates can improve thermal performance. For example, hot electrical components are best cooled by conduction. Accordingly, if a hot component is coupled to two substrates, two surfaces are available to remove heat rather than one.

Figure 31:
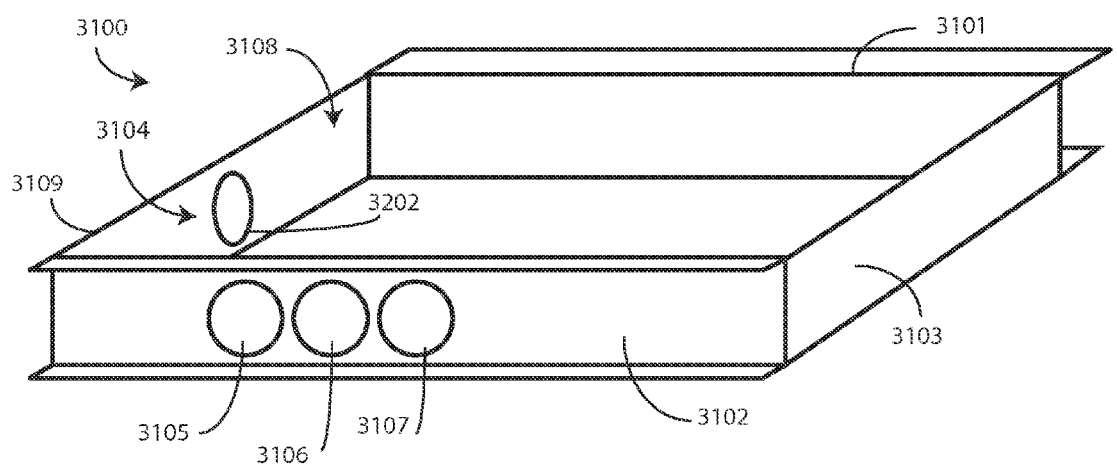
FIG. 31 illustrates a sectional view of another circuit assembly in accordance with one or more embodiments of the disclosure.

When the substrate bridging members or shield elements of the disclosure are incorporated into circuit assemblies configured in accordance with embodiments of the disclosure, they can function in many different ways. A few have been described above, including providing support for additional substrates, circuit elements, and electromagnetic radiators. However, there are still more functions that can be provided by the substrate bridging members or shield elements of the disclosure. Turning now to FIG. 31, illustrated therein is an acoustic function.

In FIG. 31, four substrate bridging members 3101,3102, 3103,3109 form the sides of an acoustic enclosure for an acoustic radiator 3104. In the illustrative embodiment of FIG. 31, the acoustic radiator 3104 is shown as a port 3202 disposed along substrate bridging member 3109. However, in other embodiments, where manufacturing techniques allow for sufficient reduction in size, the acoustic radiator 3104 can potentially be a loudspeaker or other acoustic device. In either embodiment, the structure becomes an acoustically radiating element 3100 and the substrate bridging members 3101,3102, 3103,3109 define the side walls of an acoustic chamber 3108.

Optionally, one or more ports 3105,3106,3107 can be included in one or more of the substrate bridging members 3101,3102,3103,3109. The one or more ports 3105,3106, 3107 can be used in a variety of ways. In one embodiment, the one or more ports 3105,3106,3107 can be used to tune the volume of the acoustic enclosure defined by the four substrate bridging members 3101,3102,3103,3109 and the circuit substrates that will be coupled above and below the four substrate bridging members 3101,3102,3103,3109. The tuning occurs in accordance with principles used in conventional ported loudspeaker tuning. When this occurs, the one or more ports 3105,3106,3107 define another acoustic element. In another embodiment, the one or more ports 3105,3106,3107 can be used to access other volume spaces within a circuit assembly to increase the effective volume of the acoustic enclosure. Examples of this will be described below with reference to FIGS. 32-33.

It should be noted that ports 3105,3106,3107 are optional. For example, in other embodiments, the acoustically radiating element 3100 may be portless, thereby transforming it into a closed enclosure (closed once substrates are placed atop and beneath the acoustically radiating element 3100) for an acoustic radiator, be it a port, loudspeaker, or other device.

Figure 32:
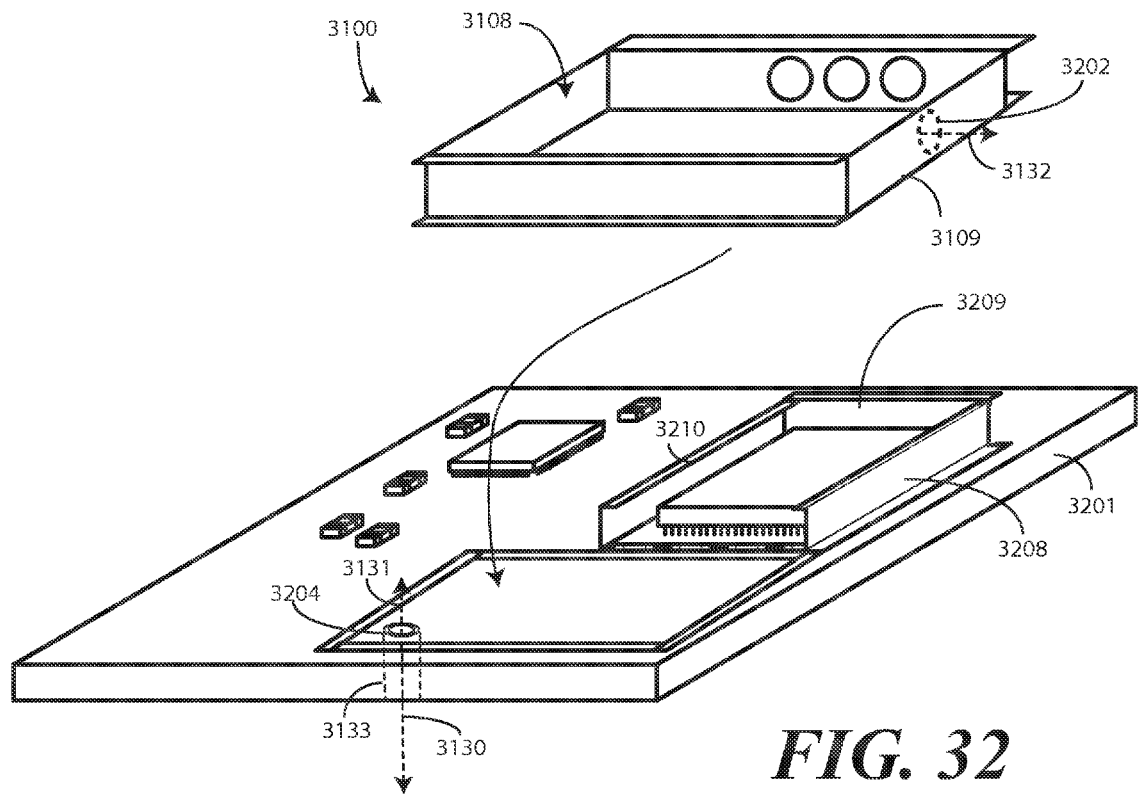
FIG. 32 illustrates explanatory substrate bridging members being applied to an explanatory substrate in accordance with one or more methods of the disclosure.

Turning with FIG. 32, the acoustically radiating element 3100 of FIG. 31 is being coupled to a first substrate 3201. A loudspeaker 3204 has been disposed on the substrate 3201. In one embodiment, port 3202 can be used either to tune the volume of the acoustic chamber 3108, or alternatively to emit sound responsive to the loudspeaker 3204. The loudspeaker 3204 can emit sound 3131 upward into the acoustic chamber 3108. This sound 3131 excites the acoustic chamber 3108 such that sound 3132 is emitted from the port 3202.

In other embodiments, port 3202 is not present. To illustrate that port 3202 is optional, it has been drawn in dashed lines in FIG. 32. Where port 3202 is absent, sound can be delivered from the system of FIG. 32 in a variety of ways. Illustrating by example, in one embodiment, the loudspeaker 3204 can emit sound 3130 through an aperture 3133 in the first substrate 3201. In this embodiment, the acoustic chamber 3108 acts as a closed volume to tune the loudspeaker 3204.

In one embodiment, the acoustically radiating element 3100 is disposed such that substrate bridging member 3102 abuts an opening of another chamber defined by substrate bridging members 3208,3209,3210. In this manner, substrate bridging member 3102 defines one or more apertures as ports (3105,3106,3107) that take advantage of the chamber defined by substrate bridging members 3208,3209,3210 to increase the effective volume of the acoustic chamber 3108. Accordingly, when a second circuit substrate is placed atop the assembly, the effective acoustic volume available to the acoustic radiator 3104 becomes the volume within the acoustically radiating element 3100 and within the substrate bridging members 3208,3209,3210 defining an adjacent volume.

Figure 33:
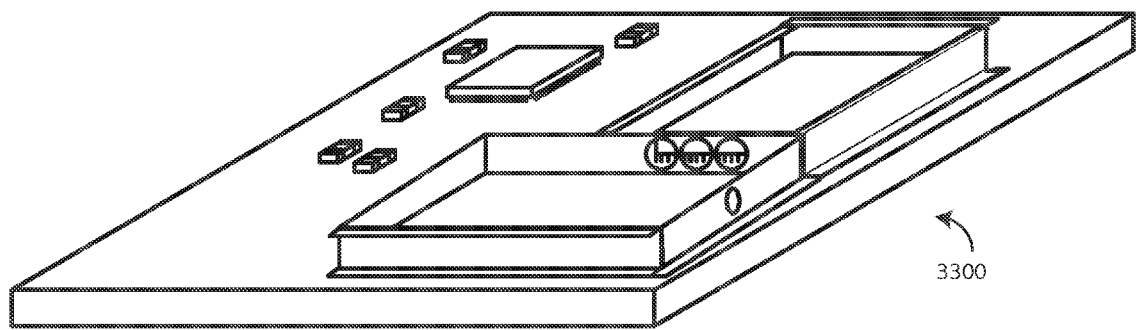
FIG. 33 illustrates an explanatory circuit substrate in accordance with one or more embodiments of the disclosure.

The resulting assembly 3300 is shown in FIG. 33. A second substrate would be placed atop this assembly 3300 to complete the circuit assembly. Note that where the substrate bridging members (3101,3102,3103,3109,3208,3209,3210) are being used as shields, the acoustic optimization can be done without compromising the shielding performance when ports (3105,3106,3107) are designed with dimensions that preclude the electromagnetic waves of interest from passing through.

Advantageously, the embodiment of FIGS. 32-33 provides acoustic usage of volume that would otherwise go unused in prior art designs. For audio performance in small electronic devices, a long-existing problem is maximizing the volume of acoustic chambers. Under prior art shields, many small components are placed, thereby leaving a lot of unused volume. In embodiments employing ports in the substrate bridging members, additional volume within a circuit assembly is accessed, which enhances the overall volume of the acoustic enclosure by using ports to get from "one honeycomb to the next" without losing shield performance.

Figure 34:
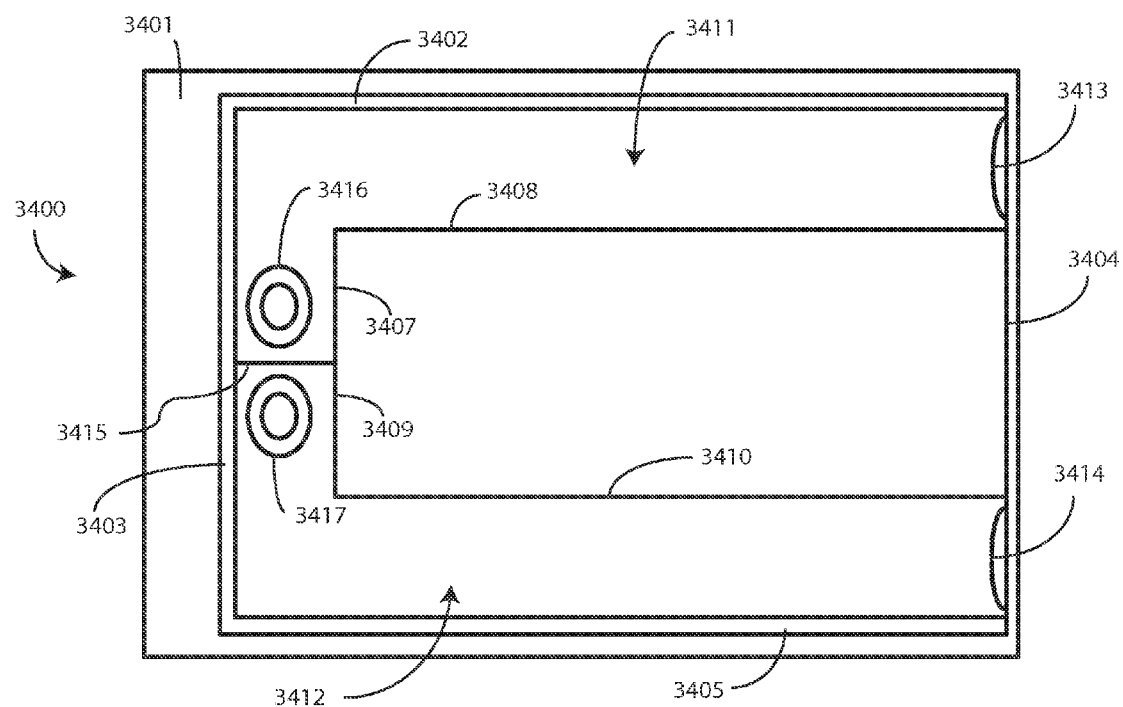
FIG. 34 illustrates an explanatory circuit substrate in accordance with one or more embodiments of the disclosure.

There are other ways acoustically radiating elements can be configured. Turning to FIG. 34 illustrated is another example. In FIG. 34, a circuit assembly 3400 includes a first substrate 3401 defining one side of the circuit assembly 3400 and a second substrate (not shown in FIG. 34 so that the interior of the circuit assembly 3400 can be seen) defines another side of the circuit assembly 3400. One or more substrate bridging members 3402,3403,3404,3405,3406,3407, 3408,3409,3410,3415 are disposed interior to the first substrate 3401 and the second substrate. In this explanatory embodiment, each substrate bridging member 3402,3403, 3404,3405,3406,3407,3408,3409,3410,3415 defines a single element with a first end bonded to the first substrate 3401 and a second end bonded to the second substrate. Two acoustic chambers 3411,3412 are defined by the substrate bridging members 3402,3403,3404,3405,3406,3407,3408,3409,3410, 3415. In this illustrative embodiment, loudspeakers 3416,3417 emit sound in the two acoustic chambers 3411,3412 that define acoustic wave guides. One or more ports 3413,3414, each defining an acoustic element, can be included in the substrate bridging members 3404 so that the acoustic wave guides can emit sound.

Figure 35:
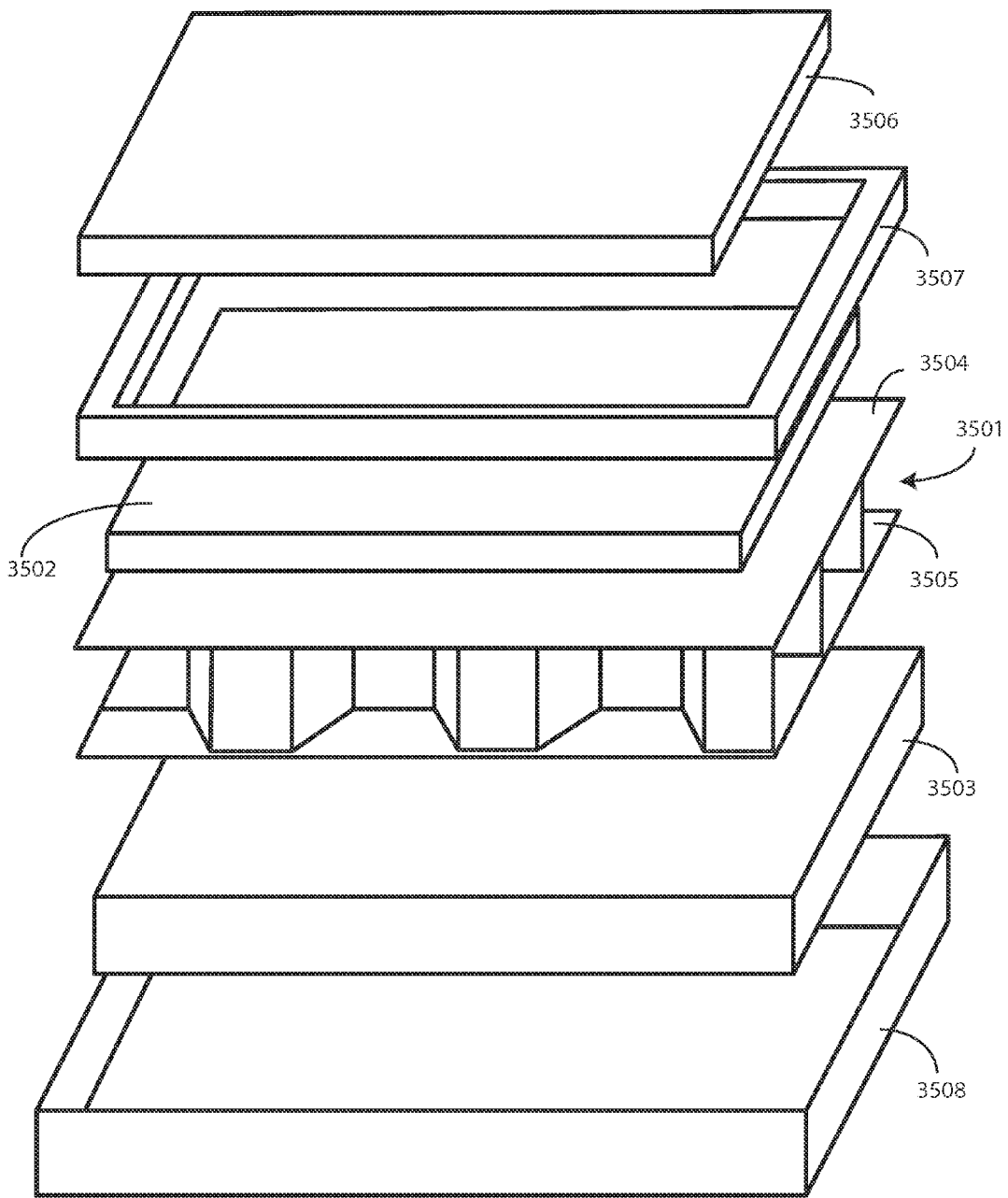
FIG. 35 illustrates an exploded view of one explanatory electronic device in accordance with one or more embodiments of the disclosure.

One main advantage offered by embodiments of the disclosure is the ability to build an electronic device as almost a completely sealed unit. The electrical components of the electronic device are almost like a potted, sealed, solid-state unit with a simple housing snapped about the outside. This reduces the cost of the housing. As noted above, in prior art electronic devices, there can be multiple screws and multiple pins. Assembly therefore takes a lot of time and allows many opportunities for error. With embodiments of the disclosure, the internal components are a simple "laminated lump." A housing simply snaps about the lump. This is shown in FIG. 35.

A circuit assembly 3501 has a display 3502 adhesively attached to a first side 3504 of the circuit assembly 3501. A battery 3503 is adhesively attached to a second side 3505 of the circuit assembly 3501. The display 3502 and the battery 3503 are electrically coupled to circuit components of the circuit assembly 3501 in one or more embodiments. An optional lens 3506 can be attached to the display 3502 in one or more embodiments. The lens 3506 goes on the front. A plastic housing 3507 is disposed about the lens 3506. The plastic housing 3507 attaches to the circuit assembly 3501 and a rear housing 3508 simply snaps on. In one or more embodiments, the plastic housing 3507 can be omitted. With this structure, the circuit components form a laminated lump and a manufacturer merely snaps a housing 3508 about the lump.

In prior art designs, users frequently purchase after market covers for their electronic devices. Instead, embodiments of the disclosure provide the laminated lump and let a purchaser—on a customized basis even—pick the housing 3508 that they desire. The housing 3508 can even be printed or decorated as desire. There are a variety of options for building the electronic device. Embodiments of the disclosure can completely eliminate the cost and the screws associated with prior art designs. This is in addition to offering the user customization options that were not available previously. Embodiments of the disclosure allow for a "made to order" model for purchasing electronic devices. A purchaser simply goes to a kiosk, store, or on-line portal and picks the colors and patterns they want for the housing 3508 and a customized device is shipped to them. Retailers or marketers can order customized devices as well.

Figure 36:
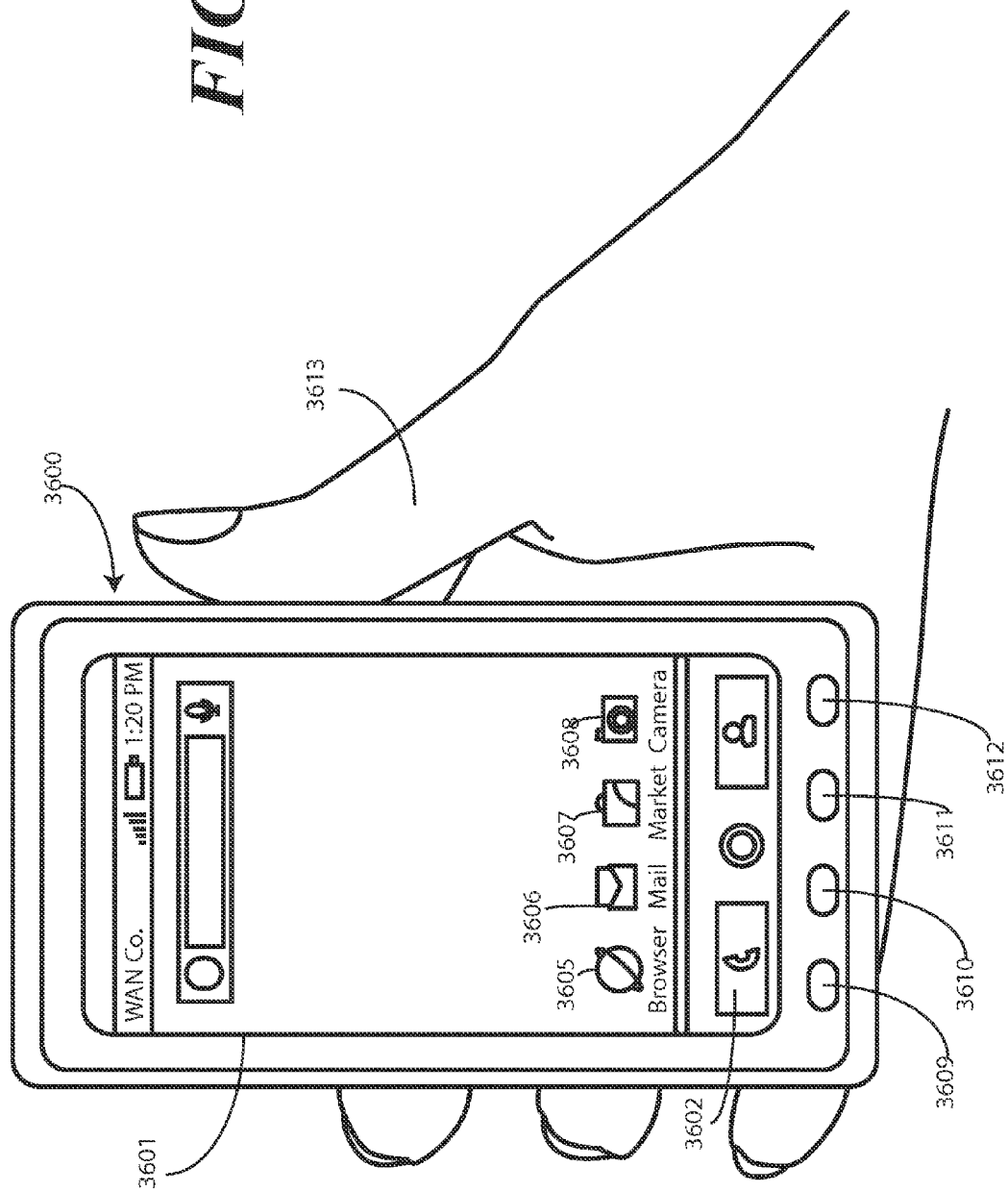
FIG. 36 illustrates one explanatory electronic device in accordance with one or more embodiments of the disclosure.

Turning now to FIG. 36, illustrated therein is one embodiment of an electronic device 3600 configured in accordance with one or more embodiments of the disclosure. The electronic device 3600 results when the elements of FIG. 35 are put together as previously described. The explanatory electronic device 3600 of FIG. 36 is shown as a smart phone for illustrative purposes. However, it will be obvious to those of ordinary skill in the art having the benefit of this disclosure that other electronic devices may be manufactured in accordance with embodiments of the disclosure as well. For example, the electronic device 3600 may be configured as a palm-top computer, a tablet computer, a gaming device, wearable computer, a media player, or other device.

A user 3613 is holding the electronic device 3600. The operating system environment, which is configured as executable code operating on one or more processors or control circuits of the circuit assembly (3501), has associated therewith various applications or "apps." Examples of such applications shown in FIG. 36 include a cellular telephone application 3602 for making voice telephone calls, a web browsing application 3605 configured to allow the user 3613 to view webpages on the display assembly 3601 of the electronic device 3600, an electronic mail application 3606 configured to send and receive electronic mail, a shopping application 3607 configured to permit a user to shop for goods and services online, and a camera application 3608 configured to capture still (and optionally video) images. These applications are illustrative only, as others will be obvious to one of ordinary skill in the art having the benefit of this disclosure.

Figure 37:
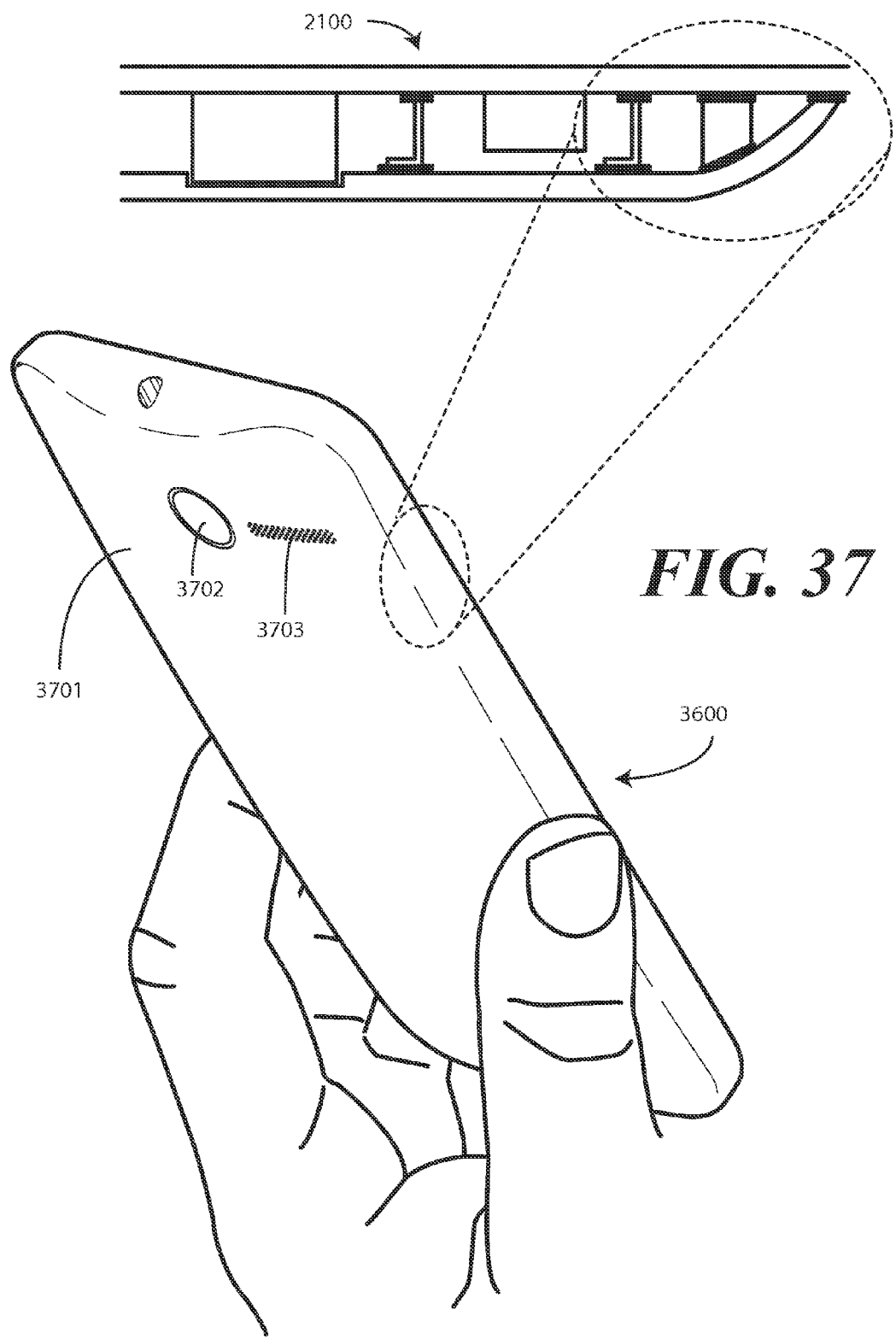
FIG. 37 illustrates another explanatory electronic device in accordance with one or more embodiments of the disclosure.

As shown in FIG. 37, the circuit assembly 2100 described above with reference to FIG. 21 can be used to form a curved housing 3701 on the back side of the electronic device 3600. As shown, the curved housing 3701 can include various features, including a camera 3702. The camera 3702 can be one of the imagers (2306) of FIG. 23 when the circuit assembly (2300) having one or more apertures (2311) is employed. Other features include a speaker port 3703. The speaker port 3703 can provide access to any of the acoustic radiators previously described.

Figure 38:
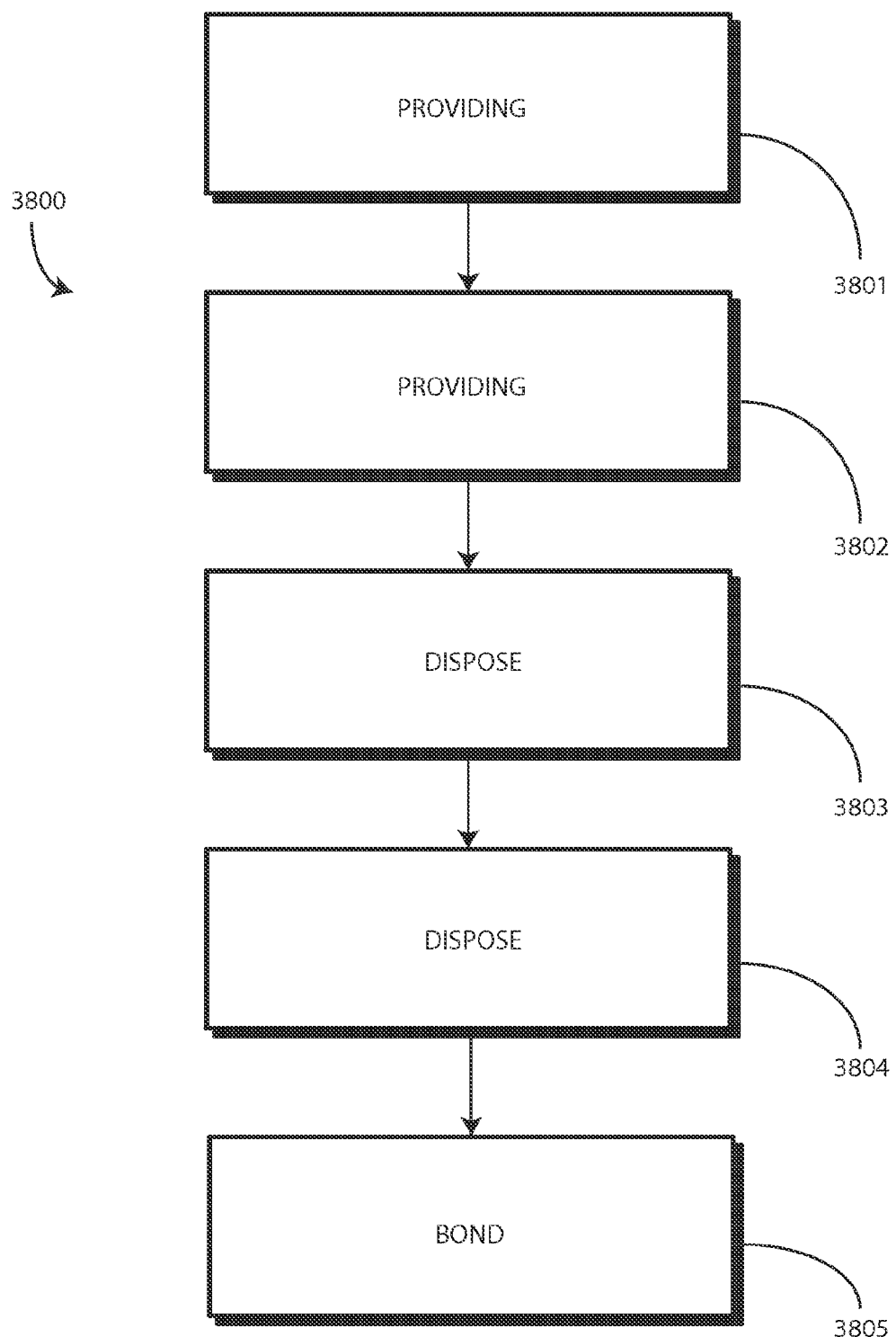
FIG. 38 illustrates an explanatory method in accordance with one or more embodiments of the disclosure.

Turning now to FIG. 38, illustrated therein is a method 3800 of constructing a circuit assembly in accordance with one or more embodiments. At step 3801, a first substrate is provided. In one embodiment, the first substrate defines a first major face. At step 3802, a second substrate is provided. In one embodiment, the second substrate defines a second major face.

At step 3803, a plurality of electrical components is disposed on one or more of the first major face or the second major face. At step 3804, one or more substrate bridging members are disposed on one of the first major face or the second major face. In one embodiment, each substrate bridging member defines a unitary structure having a first end and a second end. At step 3805, the first end is bonded to the first major face and a second end is bonded to the second major face to bridge the first circuit substrate and the second circuit substrate. In one embodiment, the first end is bonded by soldering in a reflow process. In one embodiment, the second end is bonded by soldering with a resistive heat process.

Figure 39:
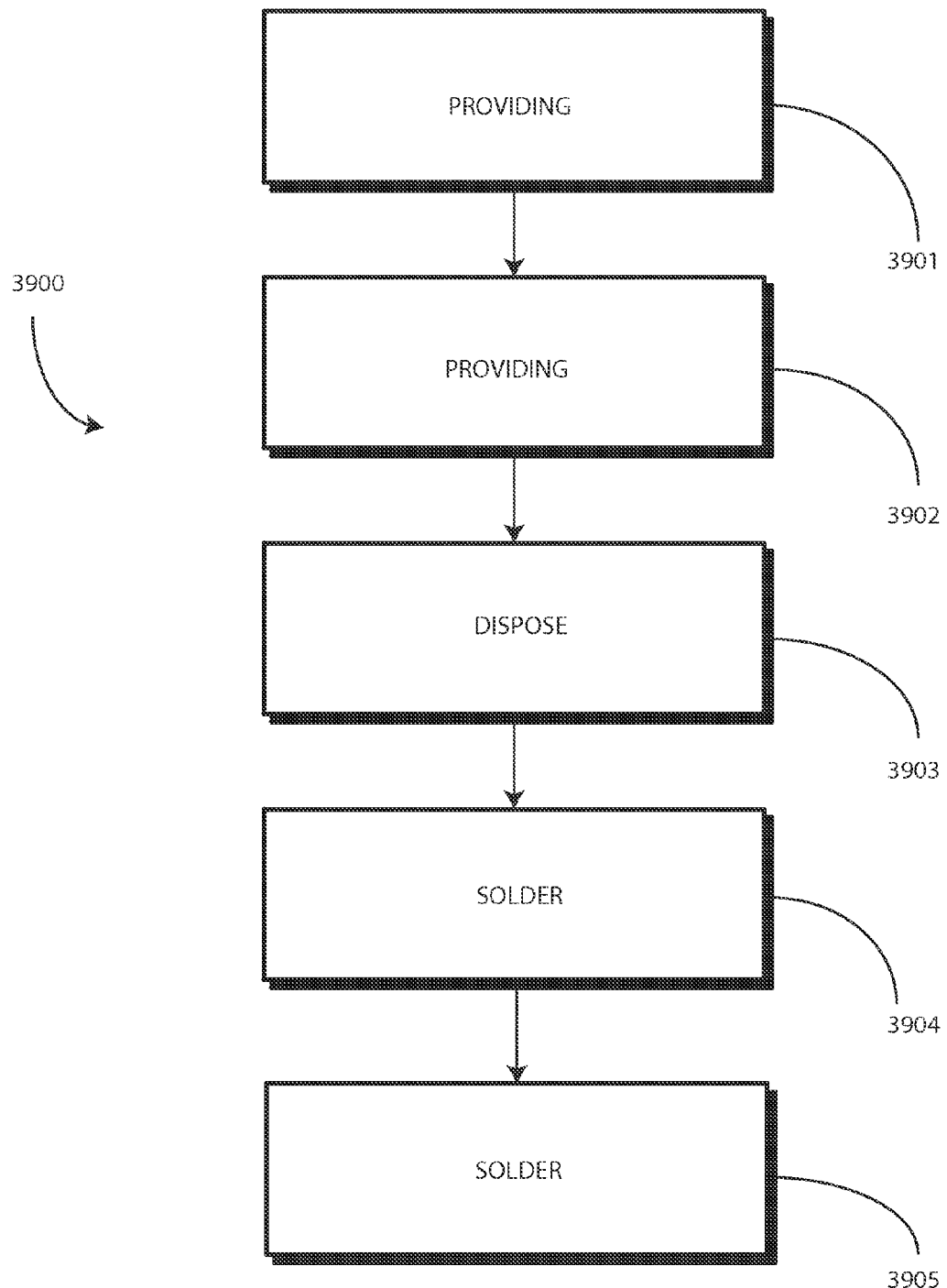
FIG. 39 illustrates another explanatory method in accordance with one or more embodiments of the disclosure.

Turning now to FIG. 39, illustrated therein is another method 3900 for manufacturing a circuit assembly in accordance with one or more embodiments of the disclosure. At step 3901, a first substrate is provided. At step 3902 a second substrate is provided. At step 3903, one or more substrate bridging members are disposed interior to the first substrate and the second substrate. In one embodiment, the one or more substrate bridging members have a unitary structure. At step 3904, a first end of the one or more substrate bridging members is soldered to the first substrate. At step 3905, a second end is soldered to the second substrate. Accordingly, the first substrate defines a first side of the circuit assembly formed at steps 3903-3904 and the second substrate defining a second side of the circuit assembly. In one embodiment, a circuit element may be disposed along at least one substrate bridging member at step 3906.

Figure 40:
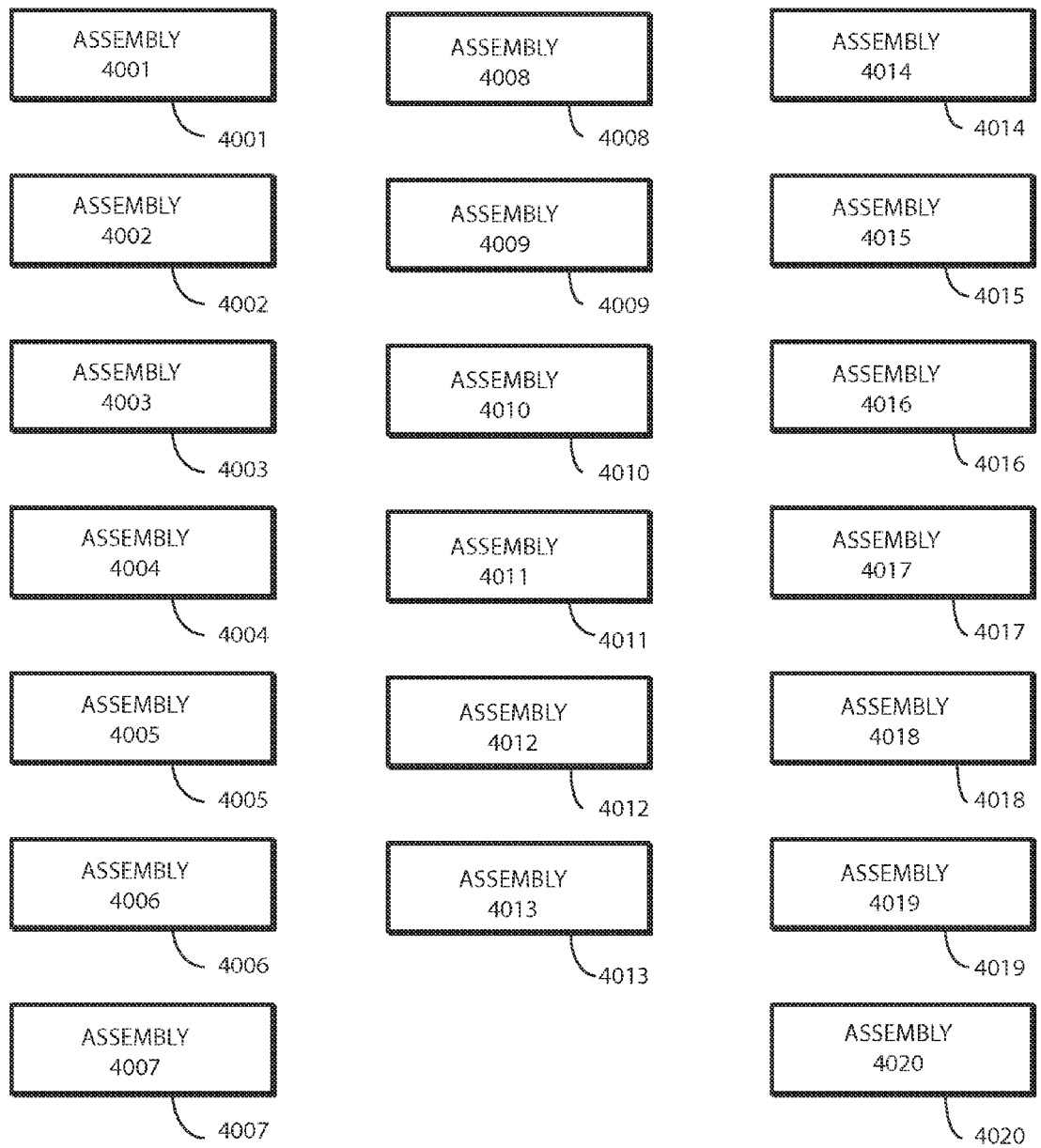
FIG. 40 illustrates various embodiments of the disclosure.

Turning now to FIG. 40, illustrated therein are various embodiments of the disclosure. At 4001, a circuit assembly, comprises a first circuit substrate defining a first major face and a second circuit substrate defining a second major face. At 4001, a plurality of electrical components is disposed on one or more of the first major face or the second major face. At 4001, the circuit assembly comprises one or more substrate bridging members. At 4001, each substrate bridging member defines a unitary structure having a first end bonded to the first major face and a second end bonded to the second major face to bridge the first circuit substrate and the second circuit substrate.

At 4002, the one or more substrate bridging members of 4001 electromagnetically shield at least one of the plurality of electrical components. At 4003, the one or more substrate bridging members of 4001 comprise metal.

At 4004, the first end of 4001 is soldered to the first major face and the second end of 4001 is soldered to the second major face. At 4005, the first end of 4004 is soldered by a reflow process and the second end of 4004 is soldered by a resistive heat process.

At 4006, at least one substrate bridging member of 6003 defines a non-linear bridge wall. At 4007, at least one substrate bridging member of 4001 is disposed interior to at least one electrical component. At 4008, the one or more substrate bridging members of 4001 comprise a plurality of substrate bridging members defining a perimeter about at least one electrical component. At 4009, one or more of the first circuit substrate or the second circuit substrate of 4008 comprise a ground plane interior to the perimeter.

At 4010, the one or more substrate bridging members of 4001 comprise a plurality of substrate bridging members disposed across the first major face and the second major face to orient the first circuit substrate substantially parallel to the second circuit substrate. At 4011, at least one electrical component of 4001 is coupled to one of the first circuit substrate or the second substrate. At 4011, another of the first circuit substrate or the second circuit substrate defines a recess. At 4011, at least a portion of the at least one electrical component of 4001 extends into the recess.

At 4012, at least one of the first circuit substrate or the second circuit substrate of 4001 is deformed. At 4013, the at least one of the first circuit substrate or the second substrate of 4012 is deformed to bond to at least another of the first circuit substrate or the second circuit substrate. At 4013, at least a portion of the first circuit substrate and the second circuit substrate of 4012 is substantially parallel to the other.

At 4014, at least one electrical component of 4001 is electrically coupled to both the first major face and the second major face. At 4015, at least some of the plurality of electrical components at 4001 are disposed on two major faces of the first circuit substrate and two other major faces of the second circuit substrate.

At 4016, a circuit assembly comprises a first circuit substrate defining a first major face and a second circuit substrate defining a second major face. At 4016, one or more electrical components are coupled to one or more of the first circuit substrate or the second circuit substrate. At 4016, the circuit assembly of 4016 comprises one or more substrate bridging members. At 4016, one of the first circuit substrate or the second circuit substrate of 4016 comprises comprising a solder pad aligned with a resistive element. At 4016, the solder pad is to heat when current is applied to the resistive element. At 4016, at least one substrate bridging member of 4016 has a first end bonded to the solder pad and a second end bonded to another of the first major face or the second major face to bridge the first circuit substrate and the second circuit substrate. At 4017, the solder pad and the resistive element of 4016 is integral to the first circuit substrate or the second circuit substrate.

At 4018, a circuit assembly comprises a first substrate defining a first side of the circuit assembly and a second substrate defining a second side of the circuit assembly. At 4018, at least one electrical component is disposed on at least one of the first substrate or the second substrate interior to the circuit assembly. At 4018, one or more unitary shield elements are disposed interior to the circuit assembly and have a first end soldered to the first substrate and a second end soldered to the second substrate.

At 4019, the circuit assembly of 4018 comprises a display, operable with the circuit assembly, attached to one of the first substrate or the second substrate exterior to the circuit assembly. At 4019, the circuit assembly of 4018 comprises a battery, operable with the circuit assembly, attached to another of the first substrate or the second substrate on a side of the circuit assembly opposite the display.

At 4020, at least one of the first substrate or the second substrate of 4018 defines an aperture. At 4020, the circuit assembly of 4018 comprises an electrical component disposed on another of the first substrate or the second substrate, the electrical component extending through the aperture.

Figure 41:
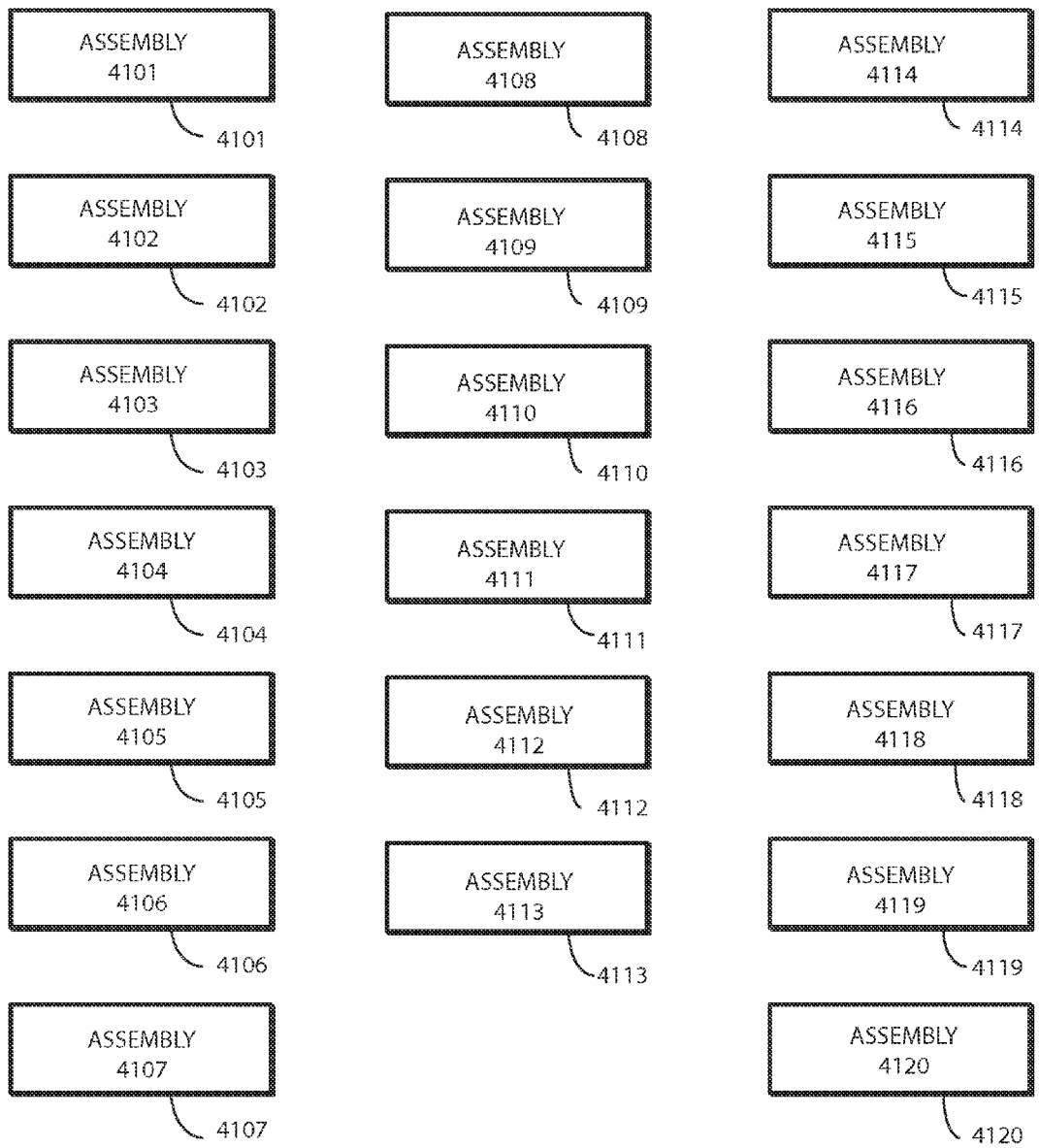
FIG. 41 illustrates various embodiments of the disclosure.

Turning now to FIG. 41, illustrated therein are various embodiments of the disclosure. At 4101, a circuit assembly comprises a first substrate defining a first side of the circuit assembly and a second substrate defining a second side of the circuit assembly. At 4101, one or more substrate bridging members are disposed interior to the circuit assembly and have a unitary structure with a first end soldered to the first substrate and a second end soldered to the second substrate. At 4101 a circuit element is disposed along at least one substrate bridging member.

At 4102, the circuit element of 4101 comprises a push button switch. At 4103, the circuit element of 4101 comprises an electrical connector.

At 4104, the circuit assembly of 4101 comprises another circuit substrate spanning the at least one substrate bridging member. At 4104, the circuit element of 4101 is disposed on the another circuit substrate. At 4105, the circuit element of 4101 comprises a circuit component. At 4106, the circuit component of 4105 comprises a surface mount circuit component soldered to the another circuit substrate. At 4107, the another circuit substrate of 4104 comprises a flexible substrate.

At 4108, a circuit assembly comprises a first substrate defining one side of the circuit assembly and a second substrate defining another side of the circuit assembly. At 4108, one or more substrate bridging members are disposed interior to the first substrate and the second substrate. At 4108, each substrate bridging member has a unitary structure with a first end bonded to the first substrate and a second end bonded to the second substrate. At 4108 at least one substrate bridging member defines a radiating element.

At 4109, the radiating element of 4108 comprises an electromagnetically radiating element. At 4110, the electromagnetically radiating element of 4109 comprises a slot antenna. At 4111, the circuit assembly of 4109 comprises another circuit substrate spanning the at least one substrate bridging member. At 4111, the electromagnetically radiating element of 4109 is disposed on the another circuit substrate.

At 4112, the radiating element of 4108 comprises an acoustically radiating element. At 41113, the acoustically radiating element of 4108 comprises a loudspeaker. At 4114, the acoustically radiating element of 4108 comprises a port.

At 4115, the circuit assembly of 4108 comprises a circuit element disposed along at least another substrate bridging member. At 4116, the circuit assembly of 4108 comprises at least one circuit element coupled to both the first substrate and the second substrate.

At 4117, a circuit assembly comprises a first substrate defining one side of the circuit assembly and a second substrate defining another side of the circuit assembly. At 4117, one or more substrate bridging members are disposed interior to the first substrate and the second substrate. At 4117 each substrate bridging member defines a single element with a first end bonded to the first substrate and a second end bonded to the second substrate. At 4117, at least one substrate bridging member defines an acoustic element.

At 4118, the one or more substrate bridging members of 4117 define an acoustic chamber. At 4119, the one or more substrate bridging members of 4118 define one or more apertures. At 4119, the at least another substrate bridging member of 4118 defines one or more corresponding apertures. At 4119, the one or more corresponding apertures are to increase a volume of the acoustic chamber. At 4020, the acoustic chamber of 4018 defines an acoustic wave guide.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A circuit assembly, comprising:
    a first circuit substrate defining a first major face;
    a second circuit substrate defining a second major face;
    an electrical component coupled to the second circuit substrate; and
    at least one substrate bridging member disposed interior to a perimeter of the circuit assembly,
    the at least one substrate bridging member defining a unitary structure having a first end coupled to the first major face; a second end coupled to the second major face, and a bridge wall extending between the first end and the second end, to bridge the first circuit substrate and the second circuit substrate, the first end extending substantially orthogonal to the bridge wall, the second end extending substantially orthogonal to the bridge wall.

2. The circuit assembly of claim 1, wherein the at least one substrate bridging member is configured to electrically shield the electrical component.

3. The circuit assembly of claim 1, wherein at least one substrate bridging member is composed entirely of metal.

4. The circuit assembly of claim 1, wherein the first end is soldered to the first major face and the second end is soldered to the second major face.

5. The circuit assembly of claim 4, wherein the first end is soldered by a reflow process, and the second end is soldered by a resistive heat process.

6. The circuit assembly of claim 1, wherein a portion of the bridge wall of the at least one substrate bridging member is non-linear.

7. The circuit assembly of claim 1, wherein the at least one substrate bridging member has a thickness in a range of about 0.15 millimeters to 0.2 millimeters.

8. The circuit assembly of claim 1, wherein the at least one substrate bridging member includes a plurality of substrate bridging members configured to surround the electrical component, a portion of the first circuit substrate including a ground plane, wherein the ground plane and the plurality of substrate bridging members are configured to electrically shield the electrical component.

9. The circuit assembly of claim 1, wherein the at least one substrate bridging member includes a plurality of substrate bridging members arranged in a honeycomb structure.

10. The circuit assembly of claim 1, wherein the at least one substrate bridging member includes a plurality of substrate bridging members disposed across the first major face and the second major face to orient the first circuit substrate substantially parallel to the second circuit substrate.

11. The circuit assembly of claim 1, wherein a portion of the first circuit substrate defines a recess, a portion of the electrical component extending into the recess.

12. The circuit assembly of claim 1, wherein the first circuit substrate includes an outer curved portion that curves to an edge of the first circuit substrate, the second circuit substrate being coupled to the outer curved portion at the edge of the first circuit substrate.

13. The circuit assembly of claim 12, wherein the first circuit substrate includes a linear portion disposed adjacent to the outer curved portion, the linear portion being coupled to the first end of the at least one substrate bridging member.

14. The circuit assembly of claim 1, further comprising:
    a circuit element disposed along the bridge wall of the at least one substrate bridging member.

15. The circuit assembly of claim 14, wherein the circuit element includes a push button switch, or an electrical connector.

16. A circuit assembly, comprising:
    a first circuit substrate defining a first major face;
    a second circuit substrate defining a second major face;
    an electrical component coupled to the second circuit substrate; and
    at least one substrate bridging member disposed between the first major face and the second major face,
    the first circuit substrate including a solder pad aligned with a resistive element, the solder pad configured to heat when current is applied to the resistive element,
    the at least one substrate bridging member having a first end coupled to the solder pad, a second end coupled to the second major face, and a bridge wall extending between the first end and the second end, to bridge the first circuit substrate and the second circuit substrate, the first end extending substantially orthogonal to the bridge wall, the second end extending substantially orthogonal to the bridge wall.

17. The circuit assembly of claim 16, wherein the solder pad and the resistive element are integral to the first circuit substrate.

18. A circuit assembly, comprising:
    a first substrate defining a first side of the circuit assembly;
    a second substrate defining a second side of the circuit assembly;
    an electrical component disposed on the second substrate interior to the circuit assembly; and
    a plurality of substrate bridging members disposed between the first side and the second side, each of the plurality of substrate bridging members including a first end coupled to the first side, a second end coupled to the second side, and a bridge wall extending between the first end and the second end, the first end extending substantially orthogonal to the bridge wall in a first direction away from the bridge wall, the second end extending substantially orthogonal to the bridge wall in a second direction away from the bridge wall, the second direction being opposite to the first direction.

19. The circuit assembly of claim 18, further comprising:
a display, operable with the circuit assembly, attached to one of the first substrate or the second substrate exterior to the circuit assembly; and
a battery, operable with the circuit assembly, attached to another of the first substrate or the second substrate on a side of the circuit assembly opposite the display.

20. The circuit assembly of claim 18, wherein the first substrate defines an aperture, and the aperture receives a portion of the electrical component.

* * * * *